(12) United States Patent
Brouk et al.

(10) Patent No.: US 9,287,086 B2
(45) Date of Patent: Mar. 15, 2016

(54) SYSTEM, METHOD AND APPARATUS FOR CONTROLLING ION ENERGY DISTRIBUTION

(75) Inventors: Victor Brouk, Fort Collins, CO (US); Randy Heckman, Fort Collins, CO (US); Daniel J. Hoffman, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 244 days.

(21) Appl. No.: 12/870,837

(22) Filed: Aug. 29, 2010

(65) Prior Publication Data
US 2011/0259851 A1 Oct. 27, 2011

Related U.S. Application Data

(63) Continuation-in-part of application No. 12/767,775, filed on Apr. 26, 2010.

(51) Int. Cl.
*H01J 37/24* (2006.01)
*C23C 14/34* (2006.01)
(Continued)

(52) U.S. Cl.
CPC .............. *H01J 37/24* (2013.01); *C23C 14/345* (2013.01); *C23C 16/50* (2013.01); *H01J 37/32009* (2013.01); *H01J 37/32082* (2013.01); *H01J 37/3299* (2013.01); *H01J 37/32174* (2013.01); *H01J 37/32935* (2013.01)

(58) Field of Classification Search
CPC .............. C23C 14/345; C23C 14/3471; C23C 14/3485; C23C 16/50; H01J 37/32018–37/32045; H01J 37/34; H01J 37/32009; H01J 37/32082; H01J 37/32174; H01J 37/32935; H01J 37/3299

USPC ......... 204/298.01–298.41; 118/723 R, 723 E, 118/723 I
See application file for complete search history.

(56) References Cited

U.S. PATENT DOCUMENTS

| | | | |
|---|---|---|---|
| 4,622,094 | A | 11/1986 | Otsubo |
| 4,693,805 | A | 9/1987 | Quazi |
| 4,963,239 | A | 10/1990 | Fujita et al. |

(Continued)

FOREIGN PATENT DOCUMENTS

| | | |
|---|---|---|
| EP | 0383570 A2 | 8/1990 |
| EP | 1978542 A1 | 10/2008 |

(Continued)

OTHER PUBLICATIONS

Atkinson, Gerard, "PCT International Search Report and Written Opinion re Application No. PCT/US10/032582", Feb. 21, 2011, Published in: PCT.

(Continued)

*Primary Examiner* — John Brayton
(74) *Attorney, Agent, or Firm* — Neugeboren O'Dowd PC

(57) ABSTRACT

Systems, methods and apparatus for regulating ion energies in a plasma chamber are disclosed. An exemplary method includes placing a substrate in a plasma chamber, forming a plasma in the plasma chamber, controllably switching power to the substrate so as to apply a periodic voltage function to the substrate, and modulating, over multiple cycles of the periodic voltage function, the periodic voltage function responsive to a desired distribution of energies of ions at the surface of the substrate so as to effectuate the desired distribution of ion energies on a time-averaged basis.

7 Claims, 19 Drawing Sheets

(51) Int. Cl.
*C23C 16/50* (2006.01)
*H01J 37/32* (2006.01)

(56) References Cited

U.S. PATENT DOCUMENTS

| | | | |
|---|---|---|---|
| 5,057,185 A * | 10/1991 | Thomas et al. | 438/710 |
| 5,156,703 A | 10/1992 | Oechsner | |
| 5,160,397 A | 11/1992 | Doki et al. | |
| 5,242,561 A * | 9/1993 | Sato | 204/192.33 |
| 5,247,669 A | 9/1993 | Abraham et al. | |
| 5,415,718 A | 5/1995 | Ohmi et al. | |
| 5,487,785 A | 1/1996 | Horiike et al. | |
| 5,535,906 A * | 7/1996 | Drummond | 216/67 |
| 5,770,972 A | 6/1998 | Collier et al. | |
| 5,859,428 A | 1/1999 | Fruchtman | |
| 5,983,828 A | 11/1999 | Savas | |
| 6,030,667 A | 2/2000 | Nakagawa et al. | |
| 6,051,114 A | 4/2000 | Yao et al. | |
| 6,110,287 A * | 8/2000 | Arai et al. | 156/345.34 |
| 6,156,667 A | 12/2000 | Jewett | |
| 6,201,208 B1 * | 3/2001 | Wendt et al. | 219/121.41 |
| 6,291,938 B1 | 9/2001 | Jewett et al. | |
| 6,313,583 B1 | 11/2001 | Arita et al. | |
| 6,326,584 B1 | 12/2001 | Jewett et al. | |
| 6,392,210 B1 | 5/2002 | Jewett et al. | |
| 6,544,895 B1 * | 4/2003 | Donohoe | 438/706 |
| 6,707,051 B2 | 3/2004 | Shun'ko | |
| 6,714,033 B1 | 3/2004 | Makhratchev et al. | |
| 6,724,148 B1 | 4/2004 | Gonzalez et al. | |
| 6,777,037 B2 | 8/2004 | Sumiya et al. | |
| 6,794,301 B2 | 9/2004 | Savas | |
| 6,819,096 B2 | 11/2004 | Gonzalez et al. | |
| 6,822,396 B2 | 11/2004 | Gonzalez et al. | |
| 6,863,018 B2 | 3/2005 | Koizumi et al. | |
| 6,872,289 B2 | 3/2005 | Mizuno et al. | |
| 6,885,153 B2 | 4/2005 | Quon | |
| 6,913,938 B2 | 7/2005 | Shanmugasundram et al. | |
| 6,920,312 B1 | 7/2005 | Benjamin | |
| 6,927,358 B2 | 8/2005 | Gonzalez et al. | |
| 6,946,063 B1 | 9/2005 | Gonzalez et al. | |
| 6,984,198 B2 | 1/2006 | Krishnamurthy et al. | |
| 7,005,845 B1 | 2/2006 | Gonzalez et al. | |
| 7,046,524 B2 | 5/2006 | Hoffman et al. | |
| 7,059,267 B2 | 6/2006 | Hedberg et al. | |
| 7,201,936 B2 | 4/2007 | Schwarm et al. | |
| 7,245,084 B1 | 7/2007 | Gonzalez et al. | |
| 7,253,117 B2 | 8/2007 | Donohoe | |
| 7,297,637 B2 | 11/2007 | Hedberg et al. | |
| 7,373,899 B2 | 5/2008 | Sumiya et al. | |
| 7,468,494 B2 | 12/2008 | Gonzalez et al. | |
| 7,520,956 B2 | 4/2009 | Samukawa et al. | |
| 7,528,386 B2 | 5/2009 | Ruzic et al. | |
| 7,725,208 B2 | 5/2010 | Shanmugasundram et al. | |
| 7,737,702 B2 * | 6/2010 | Pipitone | 324/536 |
| 7,764,140 B2 | 7/2010 | Nagarkatti et al. | |
| 7,777,179 B2 | 8/2010 | Chen et al. | |
| 7,783,375 B2 | 8/2010 | Shanmugasundram et al. | |
| 7,847,247 B2 | 12/2010 | Denpoh | |
| 8,140,292 B2 | 3/2012 | Wendt | |
| 2001/0014540 A1 | 8/2001 | Shan et al. | |
| 2002/0038631 A1 | 4/2002 | Sumiya et al. | |
| 2003/0033116 A1 | 2/2003 | Brcka et al. | |
| 2004/0094402 A1 | 5/2004 | Gopalraja et al. | |
| 2006/0088655 A1 * | 4/2006 | Collins et al. | 427/8 |
| 2006/0130971 A1 | 6/2006 | Chang et al. | |
| 2006/0226786 A1 * | 10/2006 | Lin et al. | 315/111.21 |
| 2007/0186856 A1 | 8/2007 | Yasui et al. | |
| 2007/0193975 A1 | 8/2007 | Wilson | |
| 2007/0246163 A1 | 10/2007 | Paterson et al. | |
| 2009/0077150 A1 | 3/2009 | Wendt | |
| 2009/0255800 A1 | 10/2009 | Koshimizu | |
| 2010/0072172 A1 * | 3/2010 | Ui et al. | 216/67 |
| 2010/0154994 A1 * | 6/2010 | Fischer | H01J 37/32623 156/345.24 |
| 2010/0208409 A1 | 8/2010 | Bluck et al. | |
| 2010/0276273 A1 | 11/2010 | Heckman et al. | |
| 2011/0089023 A1 | 4/2011 | Tanaka et al. | |
| 2011/0095689 A1 | 4/2011 | Gilbert | |
| 2011/0226617 A1 | 9/2011 | Hofmann et al. | |
| 2012/0052599 A1 | 3/2012 | Brouk et al. | |
| 2012/0187844 A1 | 7/2012 | Brouk et al. | |
| 2012/0217221 A1 | 8/2012 | Hoffman et al. | |
| 2012/0318456 A1 | 12/2012 | Brouk et al. | |
| 2012/0319584 A1 | 12/2012 | Brouk et al. | |
| 2014/0062495 A1 | 3/2014 | Carter et al. | |

FOREIGN PATENT DOCUMENTS

| | | |
|---|---|---|
| EP | 1129481 B1 | 2/2012 |
| GB | 2382459 A | 5/2003 |
| GB | 2400613 A | 10/2004 |
| JP | 60-126832 | 7/1985 |
| JP | 0214572 A | 5/1990 |
| JP | 04-193329 A | 7/1992 |
| JP | 09293600 | 11/1997 |
| JP | 2004193564 | 7/2004 |
| JP | 200971133 | 4/2009 |
| TW | 200811905 A | 3/2008 |
| WO | 0215222 A2 | 2/2002 |
| WO | 2010126893 A2 | 11/2010 |
| WO | 2012030500 A1 | 3/2012 |
| WO | 2012103101 A1 | 8/2012 |
| WO | 2013016619 | 1/2013 |

OTHER PUBLICATIONS

Mitrovic, Bayer, "International Search Report and Written Opinion re Application No. PCT/US2011/047467", Nov. 24, 2011, pp. 9, Published in: AU.

Jeon, M., et al., "Hydrogenated amorphous silicon film as intrinsic passivation layer deposited at various temperatures using RF remote-PECVD techinique", Current Applied Physics, Nov. 12, 2009, pp. S237-S240, vol. 10, No. (2010), Publisher: Elsevier B.V., Published in: US.

Bruno, G., et al., "Real time ellipsometry for monitoring plasma-assisted epitaxial growth of GaN", Applied Surface Sci., Jul. 7, 2006, pp. 219-223, vol. 253, No. (2006), Publisher: Elsevier B.V., Published in: US.

Giangregorio, M.M., et al., "Role of plasma activation in tailoring the nanostructure of multifunctional oxides thin films", Applied Surface Sci., Sep. 10, 2008, pp. 5396-5400, vol. 255, No. (2009), Publisher: Elsevier B.V., Published in: US.

Vanedi, V., et al., "Verification of frequency scaling laws for capacitive radio-frequency discharges using two-dimensional simulations", Phys. Fluids B, Jul. 1993, pp. 2719-2729, vol. 5, No. 7, Publisher: Am. Inst. of Physics, Published in: US.

Rauf, S., et al., "Nonlinear Dynamics of Radio Frequency Plasma Processing Reactors Powered by Multifrequency Sources", IEEE Transactions on Plasma Science, Oct. 5, 1999, pp. 1329-1338, vol. 27, No. 5, Publisher: IEEE.

Raoux, S., et al., "Remote microwave plasma source for cleaning chemical vapor deposition chambers; Technology for reducing global warming gas emissions", J. Vac. Sci. Technol. B Mar./Apr. 1999, 1999, pp. 477-485, vol. 17, No. 2, Publisher: Am. Vacuum Soc'y, Published in: US.

Gangoli, S.P., et al., "Production and transport chemistry of atomic fluorine in remote plasma source and cylindrical reaction chamber", J. Phys. D: Appl. Phys., Aug. 16, 2007, pp. 5140-5154, vol. 40, No. (2007), Publisher: IOP Publishing Ltd., Published in: UK.

Yun, Y.B., et al., "Effects of various additive gases on chemical dry etching rate enhancement of low-k SiOCH layer in F2/Ar remote plasmas", Thin Solid Films, Aug. 15, 2007, pp. 3549-3553, vol. 516, No. (2008), Publisher: Elsevier B.V., Published in: US.

Kuo, M.S., et al., "Influence of C4F8/Ar-based etching and H2-based remote plasma ashing processes on ultralow k materials modifications", J. Vac. Sci. Technol., B, Mar./Apr. 2010, Mar. 19, 2010, pp. 284-294, vol. 28, No. 2, Publisher: Am. Vacuum Soc'y, Published in: US.

Heil, S.B.S., et al., "Deposition of TiN and HfO2 in a commercial 200 mm plasma atomic layer deposition reactor", J. Vac. Sci. Technol. A,

(56) References Cited

OTHER PUBLICATIONS

Sep./Oct. 2007, Jul. 31, 2007, pp. 1357-1366, vol. 25, No. 5, Publisher: Am. Vacuum Soc'y, Published in: US.
Kim, J.Y., et al., "Remote plasma enhanced atomic layer deposition of TiN thin films using metalorganic precursor", J. Vac. Sci. Technol. A, Jan./Feb. 2004, Nov. 13, 2003, pp. 8-12, vol. 22, No. 1, Publisher: Am. Vacuum Soc'y, Published in: US.
Wakeham, S.J., et al., "Low temperature remote plasma sputtering of indium tin oxide for flexible display applications", Thin Solid Films, May 12, 2009, pp. 1355-1358, vol. 519, No. (2009), Publisher: Elsevier B.V.
Ohachi, T., et al., "Measurement of nitrogen atomic flux for RF-MBE growth of GaN and AlN on Si substrates", J. of Crystal Growth, Jan. 20, 2009, pp. 2987-2991, vol. 311, No. (2009), Publisher: Elsevier B.V.
Honda, S., et al., "Hydrogenation of polycrystalline silicon thin films", Thin Solid Films, Oct. 5, 2005, pp. 144-148, vol. 501, No. (2006), Publisher: Elsevier B.V., Published in: US.
Bryns, B., et al., "A VHF driven coaxial atmospheric air plasma: electrical and optical characterization", Dec. 16, 2011, pp. 1-18, No. Rev. 2-0, Publisher: N. C. ST. U., Dep't of Nuclear Engr., Published in: US.
Kudelka, Stephan, Supplementary European Search Report re EP Application 10 77 0205.2, PCT/US10/032582, Jan. 30, 2013, pp. 8, Published in: NL.
Emsellem, G., "Electrodeless Plasma Thruster Design Characteristics", Jul. 11, 2005, pp. 22, Publisher: 41st Joint Propulsion Conference, Tucson, Published in: US.
George, M.A., et al., "Silicon Nitride Arc Thin Films by New Plasma Enhanced Chemical Vapor Deposition Source Technology", Jul. 7, 2011, pp. 1-5, Article downloaded from www.generalplasma.com, Published in: US.
Krolak, M, "Matthew Krolak's MyElectricEngine.Com Megnetoplasmadynamic (MPD) Thruster Design", Apr. 28, 2011, pp. 7, Webpage downloaded from http://myelectricengine.com/projects/mpdthruster/mpdthruster.html, Published in: US.
McLeod, Austin, Office Action re U.S. Appl. No. 12/767,775, Oct. 17, 2012, Published in: US.
Guinea, William, International Search Report and Written Opinion re Application No. PCT/US12/048504, Sep. 17, 2012, Published in: AU.
Lindner, Nora, International Preliminary Report on Patentability re Application PCT/US2010/032582, Nov. 1, 2011, pp. 8, Published in: CH.
Rabbani, Firoozeh, International Search Report and Written Opinion re application No. PCT/US2012/022380, Mar. 14, 2012, Published in: AU.
Devlin, Martin, International Search Report and Written Opinion re application No. PCT/US2012/029953, May 28, 2012, pp. 11, Published in: AU.
Wang, S.B., et al., "Control of ion energy distribution at substrates during plasma processing", J. Applied Physics, Jul. 15, 2000, pp. 643-646, vol. 88, No. 2, Publisher: Am. Inst. of Physics, Published in: US.
Buzzi, F.L., et al, "Energy Distribution of Bombarding Ions in Plasma Etching of Dielectrics", "AVS 54th International Symposium", Oct. 15, 2007, Publisher: Univ. of Wisconsin—Madison, Published in: US.
Silapunt, R., et al., "Ion Bombardment Energy Control for Selective Fluorocarbon Plasma Etching of Organosilicate Glass", "J. Vac. Sci. Technol", 2004, pp. 826-831, vol. B22, No. 2, Publisher: American Vacuum Society, Published in: US.
Masaaki Awano, "Japanese Office Action re Application No. 2012-508593", Apr. 19, 2013, pp. 11, Published in: JP.
Duk Yeul Baek, "Korean Office Action re Applcation No. 10-2011-7009075", Mar. 25, 2013, pp. 2, Published in: KR.
Baharlou, Simin, "International Preliminary Report on Patentability re Application No. PCT/US2011/047467", Mar. 14, 2013, pp. 7, Published in: CH.

Yamamoto, Shusaku, "Response to Japanese Office Action re Application No. 2012-508593", Aug. 16, 2013, pp. 9, Published in: JP.
Abraham, Ibrahime A., "Office Action re U.S. Appl. No. 12/767,775", Apr. 25, 2013, pp. 28, Published in: US.
Brayton, John Joseph, "Office Action re U.S. Appl. No. 13/193,345", Jun. 6, 2013, pp. 8, Published in: US.
Brayton, John Joseph, "Office Action re U.S. Appl. No. 13/193,299", Aug. 8, 2013, pp. 7, Published in: US.
O'Dowd, Sean R. , "Response to Office Action re U.S. Appl. No. 12/767,775", Mar. 17, 2013, pp. 6, Published in: US.
O'Dowd, Sean R., "Response to Office Action re U.S. Appl. No. 12/767,775", Jul. 25, 2013, pp. 7, Published in: US.
Gruber, Stephen S., "Response to Office Action re U.S. Appl. No. 13/193,345", Jul. 30, 2013, pp. 9, Published in: US.
Gruber, Stephen S., "Response to Office Action re U.S. Appl. No. 13/193,299", Aug. 28, 2013, pp. 9, Published in: US.
Masaaki, Awano, "Japanese Office Action re Application No. 2012-508593", Sep. 11, 2013, pp. 7, Published in: JP.
Abraham, Ibrahime A., "Office Action re U.S. Appl. No. 12/767,775", Sep. 10, 2013, pp. 30, Published in: US.
O'Dowd, Sean R., "Reponse to Office Action re U.S. Appl. No. 12/767,775", Nov. 5, 2013, pp. 6, Published in: US.
Brayton, John Joseph, "Office Action re U.S. Appl. No. 13/193,345", Nov. 7, 2013, pp. 36, Published in: US.
Yafeng, "Chinese Office Action re Application No. 201080003206.X", Sep. 4, 2013, pp. 15, Published in: CN.
Brayton, John Joseph, "Office Action re U.S. Appl. No. 13/193,299", Dec. 18, 2013, pp. 43, Published in: US.
Baharlou, Simin, "International Preliminary Report on Patentability re Application No. PCT/US2012/048504", Feb. 6, 2014, pp. 11, Published in: CH.
Ramachandran, Mani, "International Search Report and Written Opinion re Application No. PCT/US2013/056634", Nov. 15, 2013, pp. 10, Published in: AU.
Williams, Jim, "International Search Report and Written Opinion re Application No. PCT/US2013/056647", Oct. 30, 2013, pp. 10, Published in: AU.
Mitrovic, Bayer, "International Search Report and Written Opinion re Application No. PCT/US2013/056657", Oct. 28, 2013, pp. 11, Published in: AU.
Panta, Kusha, "Internaitonal Search Report and Written Opinion re Application No. PCT/US2013/056659", Nov. 8, 2013, pp. 11, Published in: AU.
Williams, Jim, "International Search Report and Written Opinion re Application No. PCT/US2013/056851", Nov. 18, 2013, pp. 11, Published in: AU.
TIPO, "Taiwain Office Action re Application No. 099113815", Jan. 27, 2014, pp. 6, Published in: TW.
Xiubo, et al., "Charging of dielectric substrate materials during plasma immersion ion implantation", Nov. 9, 2001, pp. 7, Published in: HK.
Brayton, John Joseph, "Office Action re U.S. Appl. No. 13/193,299", Sep. 26, 2014, pp. 37, Published in: US.
O'Dowd, Sean R., "Response to Office Action re U.S. Appl. No. 12/767,775", Nov. 3, 2014, pp. 13, Published in: US.
TIPO, "Taiwan Office Action re Application No. 101127182", Sep. 11, 2014, pp. 11, Published in: TW.
SIPO, "Chinese Office Action re Application No. 201080003206.X", May 23, 2014, pp. 6, Published in: CN.
Sathiraju, Srinivas, "Office Action re U.S. Appl. No. 13/597,032", Jun. 20, 2014, pp. 42, Published in: US.
Brayton, John Joseph, "Office Action re U.S. Appl. No. 13/193,345", Jul. 7, 2014, pp. 26, Published in: US.
Gruber, Stephen S., "Response to Office Action re U.S. Appl. No. 13/193,299", May 19, 2014, pp. 18, Published in: US.
O'Dowd, Sean R., "Response to Office Action re U.S. Appl. No. 13/193,345", Mar. 7, 2014, pp. 7, Published in: US.
TIPO, "Taiwan Office Action re Application No. 099113815", Jun. 18, 2014, pp. 2, Published in: TW.
Yafeng, Zhang, "Chinese Office Action re Application No. 201080003206.X", Nov. 26, 2014, pp. 6, Published in: CN.
Shamim, Ahmed, "Office Action re U.S. Appl. No. 14/011,305", Dec. 4, 2014, pp. 28, Published in: US.

(56) References Cited

OTHER PUBLICATIONS

Abraham, Ibrahime A., "Office Action re U.S. Appl. No. 12/767,775", Dec. 15, 2014, pp. 37, Published in: US.

O'Dowd, Sean, "Office Action Response re U.S. Appl. No. 13/597,032", Dec. 16, 2014, pp. 11, Published in: US.

O'Dowd, Sean, "Response to Office Action re U.S. Appl. No. 13/193,345", Dec. 8, 2014, pp. 8, Published in: US.

The Korean Intellectual Property Office, "Korean Office Action re Application No. 10-2013-7007594", Jul. 28, 2014, pp. 2, Published in: KR.

Abraham, Ibrahime A., "Office Action re U.S. Appl. No. 12/767,775", Jul. 1, 2014, pp. 48, Published in: US.

Moku, Tetsuji, "Japanese Office Action re Application No. 2013-527088", Apr. 21, 2015, pp. 10, Published in: JP.

Moku, Tetsuji, "Japanese Office Action re Application No. 2014-523-057", Apr. 21, 2015, pp. 11, Published in: JP.

Brayton, John Joseph, "Restriction Requirement re U.S. Appl. No. 13/597,050", Jan. 27, 2015, pp. 7, Published in: US.

Brayton, John Joseph, "Restriction Requirement re U.S. Appl. No. 13/596,976", Feb. 23, 2015, pp. 8, Published in: US.

Brayton, John Joseph, "Restriction Requirement re U.S. Appl. No. 13/597,093", Mar. 23, 2015, pp. 9, Published in: US.

Brayton, John Joseph, "Office Action re U.S. Appl. No. 14/606,857", Apr. 8, 2015, pp. 51, Published in: US.

Sathiraju, Srinivas, "Office Action re U.S. Appl. No. 13/597,032", Apr. 9, 2015, pp. 32, Published in: US.

Brayton, John Joseph, "Office Action re U.S. Appl. No. 13/193,345", Apr. 16, 2015, pp. 34, Published in: US.

Wittmann-Regis, Agnes, "International Preliminary Report on Patentability re Application No. PCT/US2013/056634", Mar. 12, 2015, pp. 7, Published in: CH.

Nickitas-Etienne, Athina, "International Preliminary Report on Patentability re Application No. PCT/US2013/056647", Mar. 12, 2015, pp. 7, Published in: CH.

Mohri, Mineko, "International Preliminary Report on Patentability re Application No. PCT/US2013/056657", Mar. 12, 2015, pp. 8, Published in: CH.

Mohri, Mineko, "International Preliminary Report on Patentability re Application No. PCT/US2013/056659", Mar. 12, 2015, pp. 8, Published in: CH.

Nakamura, Yukari, "International Preliminary Report on Patentability re Application No. PCT/US2013/056851", Mar. 12, 2015, pp. 8, Published in: CH.

O'Dowd, Sean R., "Office Action Response re U.S. Appl. No. 12/767,775", Feb. 27, 2015, pp. 6, Published in: US.

Gruber, Stephen S., "Response to Restriction Requirement re U.S. Appl. No. 13/597,050", Mar. 26, 2015, pp. 11, Published in: US.

O'Dowd, Sean R., "Response to Office Action re U.S. Appl. No. 13/193,299", Mar. 26, 2015, pp. 7, Published in: US.

Gruber, Stephen S. "Response to Office Action re U.S. Appl. No. 14/011,305", Mar. 4, 2015, pp. 10, Published in: US.

SIPO, "Chinese Office Action re Application No. 201180046783.1", Mar. 24, 2015, pp. 18, Published in: CN.

Yafeng, Zhang, "Chinese Office Action re Application No. 201080003206.X", Jun. 10, 2015, pp. 8, Published in: CN.

Brayton, John Joseph, "Office Action re Application No. 13/193,299", May 21, 2015, pp. 24, Published in: US.

Abraham, Ibrahime A., "Office Action re U.S. Appl. No. 12/767,775", Jun. 17, 2015, pp. 28, Published in: US.

Brayton, John Joseph, "Office Action re U.S. Appl. No. 13/597,050", Jul. 17, 2015, pp. 86, Published in: US.

O'Dowd, Sean R., "Response to Office Action re U.S. Appl. No. 13/596,976", Jul. 23, 2015, pp. 10, Published in: US.

O'Dowd, Sean R., "Response to Office Action re U.S. Appl. No. 13/597,093", Jul. 23, 2015, pp. 9, Published in: US.

SIPO, "Chinese Office Action re Application No. 201280047162.X", Sep. 6, 2015, pp. 18, Published in: CN.

Aguilar, Maria, "European Search Report re Application No. EP11822326", Oct. 9, 2015, pp. 3, Published in: EP.

Brayton, John Joseph, "US Office Action re U.S. Appl. No. 13/597,093", Nov. 5, 2015, pp. 76, Published in: US.

Brayton, John Joseph, "US Office Action re U.S. Appl. No. 13/596,976", Nov. 6, 2015, pp. 77, Published in: US.

O'Dowd, Sean R., "Response to Office Action re U.S. Appl. No. 14/606,857", Jul. 8, 2015, pp. 10, Published in: US.

Percival, Shane, "Response to Office Action re U.S. Appl. No. 13/597,032", Aug. 7, 2015, pp. 17, Published in: US.

O'Dowd, Sean, "Response to Office Action re U.S. Appl. No. 13/193,299", Aug. 20, 2015, pp. 10, Published in: US.

O'Dowd, Sean, "Response to Office Action re U.S. Appl. No. 13/193,345", Oct. 13, 2015, pp. 7, Published in: US.

O'Dowd, Sean, "Response to Office Action re U.S. Appl. No. 12/767,775", Oct. 19, 2015, pp. 9, Published in: US.

SIPO, "Office Action re Chinese Application No. 2011800467811", Dec. 08, 2015, Published in: CN.

\* cited by examiner

SYSTEM, METHOD AND APPARATUS FOR CONTROLLING ION ENERGY DISTRIBUTION

PRIORITY

The present application is a continuation-in-part of application Ser. No. 12/767,775 filed Apr. 26, 2010 entitled METHOD AND APPARATUS FOR CONTROLLING ION ENERGY DISTRIBUTION, which is incorporated herein by reference.

FIELD OF THE INVENTION

The present invention relates generally to plasma processing. In particular, but not by way of limitation, the present invention relates to methods and apparatuses for plasma-assisted etching and/or deposition.

BACKGROUND OF THE INVENTION

Many types of semiconductor devices are fabricated using plasma-based etching techniques. If it is a conductor that is etched, a negative voltage with respect to ground may be applied to the conductive substrate so as to create a substantially uniform negative voltage across the surface of the substrate conductor, which attracts positively charged ions toward the conductor, and as a consequence, the positive ions that impact the conductor have substantially the same energy.

If the substrate is a dielectric, however, a non-varying voltage is ineffective to place a voltage across the surface of the substrate. But an AC voltage (e.g., high frequency) may be applied to the conductive plate (or chuck) so that the AC field induces a voltage on the surface of the substrate. During the positive half of the AC cycle, the substrate attracts electrons, which are light relative to the mass of the positive ions; thus many electrons will be attracted to the surface of the substrate during the positive part of the cycle. As a consequence, the surface of the substrate will be charged negatively, which causes ions to be attracted toward the negatively-charged surface. And when the ions impact the surface of the substrate, the impact dislodges material from the surface of the substrate—effectuating the etching.

In many instances, it is desirable to have a narrow ion energy distribution, but applying a sinusoidal waveform to the substrate induces a broad distribution of ion energies, which limits the ability of the plasma process to carry out a desired etch profile. Known techniques to achieve a narrow ion energy distribution are expensive, inefficient, difficult to control, and may adversely affect the plasma density. As a consequence, these known techniques have not been commercially adopted. Accordingly, a system and method are needed to address the shortfalls of present technology and to provide other new and innovative features.

SUMMARY OF THE INVENTION

Illustrative embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents, and alternative constructions that fall within the spirit and scope of the invention as expressed in the claims.

According to one embodiment, the invention may be characterized as a system for plasma-based processing. The system in this embodiment includes a plasma processing chamber configured to contain a plasma and a substrate support positioned within the plasma processing chamber that is disposed to support a substrate. In addition, an ion-energy control portion provides at least one ion-energy control signal responsive to at least one ion-energy distribution setting that is indicative of a desired ion energy distribution at the surface of the substrate. A switch-mode power supply applies power to the substrate to effectuate the desired ion energy distribution at the surface of the substrate, and an ion current compensation component in this embodiment provides a controllable width of the ion energy distribution.

According to another embodiment, the invention may be described as a method for plasma-based processing that includes controllably switching power to the substrate so as to apply a periodic voltage function to the substrate and modulating, over multiple cycles of the periodic voltage function, the periodic voltage function responsive to a desired ion energy distribution at the surface of the substrate so as to effectuate the desired ion energy distribution on a time-averaged basis.

According to yet another embodiment, the invention may be characterized as a plasma-based processing apparatus that includes a switch-mode power supply configured to apply a periodic voltage function and an ion-energy control portion that modulates, over multiple cycles of the periodic voltage function, at least one parameter of the periodic voltage function responsive to at least one ion-energy distribution setting that is indicative of a desired ion energy distribution at the surface of the substrate.

These and other embodiments are described in further detail herein.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings where like or similar elements are designated with identical reference numerals throughout the several views and wherein:

DETAILED DESCRIPTION

Figure 1:
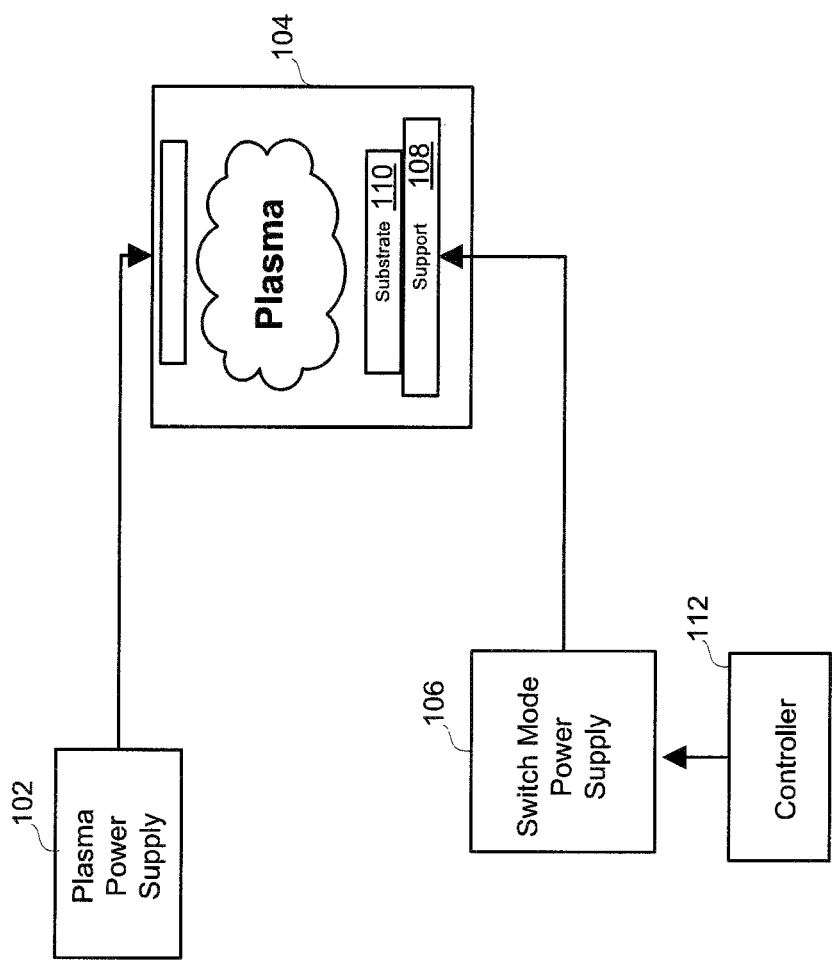
FIG. 1 illustrates a block diagram of a plasma processing system in accordance with one implementation of the present invention.

An exemplary embodiment of a plasma processing system is shown generally in FIG. 1. As depicted, a plasma power supply 102 is coupled to a plasma processing chamber 104 and a switch-mode power supply 106 is coupled to a support 108 upon which a substrate 110 rests within the chamber 104. Also shown is a controller 112 that is coupled to the switch-mode power supply 106.

In this exemplary embodiment, the plasma processing chamber 104 may be realized by chambers of substantially conventional construction (e.g., including a vacuum enclosure which is evacuated by a pump or pumps (not shown)). And, as one of ordinary skill in the art will appreciate, the plasma excitation in the chamber 104 may be by any one of a variety of sources including, for example, a helicon type plasma source, which includes magnetic coil and antenna to ignite and sustain a plasma 114 in the reactor, and a gas inlet may be provided for introduction of a gas into the chamber 104.

As depicted, the exemplary plasma chamber 104 is arranged and configured to carry out plasma-assisted etching of materials utilizing energetic ion bombardment of the substrate 110. The plasma power supply 102 in this embodiment is configured to apply power (e.g., RF power) via a matching network (not shown)) at one or more frequencies (e.g., 13.56 MHz) to the chamber 104 so as to ignite and sustain the plasma 114. It should be understood that the present invention is not limited to any particular type of plasma power supply 102 or source to couple power to the chamber 104, and that a variety of frequencies and power levels may be may be capacitively or inductively coupled to the plasma 114.

As depicted, a dielectric substrate 110 to be treated (e.g., a semiconductor wafer), is supported at least in part by a support 108 that may include a portion of a conventional wafer chuck (e.g., for semiconductor wafer processing). The support 108 may be formed to have an insulating layer between the support 108 and the substrate 110 with the substrate 110 being capacitively coupled to the platforms but may float at a different voltage than the support 108.

As discussed above, if the substrate 110 and support 108 are conductors, it is possible to apply a non-varying voltage to the support 108, and as a consequence of electric conduction through the substrate 110, the voltage that is applied to the support 108 is also applied to the surface of the substrate 110.

When the substrate 110 is a dielectric, however, the application of a non-varying voltage to the support 108 is ineffective to place a voltage across the treated surface of the substrate 110. As a consequence, the exemplary switch-mode power supply 106 is configured to be controlled so as to effectuate a voltage on the surface of the substrate 110 that is capable of attracting ions in the plasma 114 to collide with the substrate 110 so as to carry out a controlled etching and/or deposition of the substrate 110.

Moreover, as discussed further herein, embodiments of the switch-mode power supply 106 are configured to operate so that there is an insubstantial interaction between the power applied (to the plasma 114) by the plasma power supply 102 and the power that is applied to the substrate 110 by the switch-mode power supply 106. The power applied by the switch-mode power supply 106, for example, is controllable so as to enable control of ion energy without substantially affecting the density of the plasma 114.

Furthermore, many embodiments of the exemplary switch-mode supply 106 depicted in FIG. 1 are realized by relatively inexpensive components that may be controlled by relatively simple control algorithms. And as compared to prior art approaches, many embodiments of the switch mode power supply 106 are much more efficient; thus reducing energy costs and expensive materials that are associated with removing excess thermal energy.

One known technique for applying a voltage to a dielectric substrate utilizes a high-power linear amplifier in connection with complicated control schemes to apply power to a substrate support, which induces a voltage at the surface of the substrate. This technique, however, has not been adopted by commercial entities because it has not proven to be cost effective nor sufficiently manageable. In particular, the linear amplifier that is utilized is typically large, very expensive, inefficient, and difficult to control. Furthermore, linear amplifiers intrinsically require AC coupling (e.g., a blocking capacitor) and auxiliary functions like chucking are achieved with a parallel feed circuit which harms AC spectrum purity of the system for sources with a chuck.

Another technique that has been considered is to apply high frequency power (e.g., with one or more linear amplifiers) to the substrate. This technique, however, has been found to adversely affect the plasma density because the high frequency power that is applied to the substrate affects the plasma density.

In some embodiments, the switch-mode power supply 106 depicted in FIG. 1 may be realized by buck, boost, and/or buck-boost type power technologies. In these embodiments, the switch-mode power supply 106 may be controlled to apply varying levels of pulsed power to induce a potential on the surface of the substrate 110.

Figure 2:
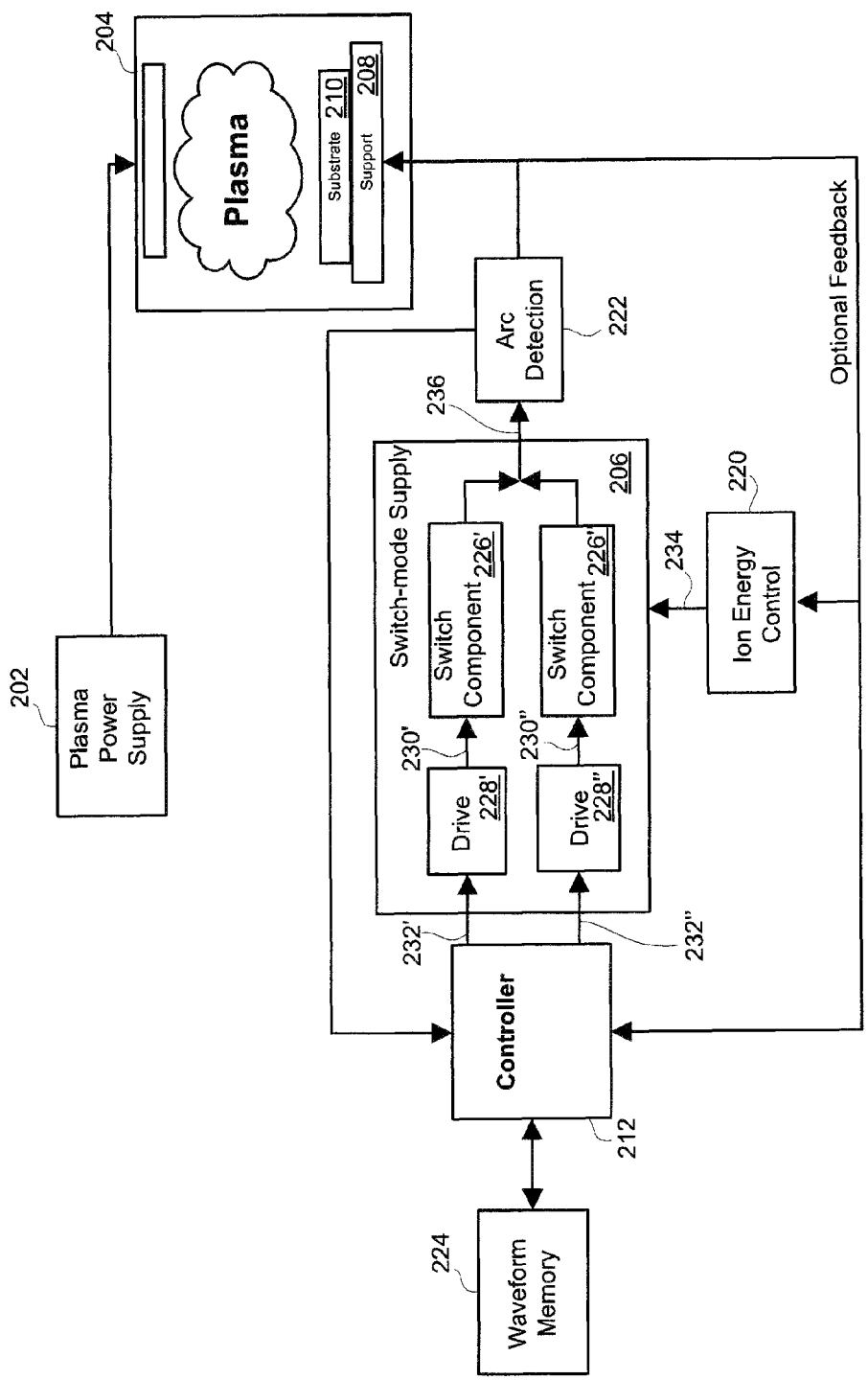
FIG. 2 is a block diagram depicting an exemplary embodiment of the switch-mode power system depicted in FIG. 1.

In other embodiments, the switch-mode power supply 106 is realized by other more sophisticated switch mode power and control technologies. Referring next to FIG. 2, for example, the switch-mode power supply described with reference to FIG. 1 is realized by a switch-mode bias supply 206 that is utilized to apply power to the substrate 110 to effectuate one or more desired energies of the ions that bombard the substrate 110. Also shown are an ion energy control component 220, an arc detection component 222, and a controller 212 that is coupled to both the switch-mode bias supply 206 and a waveform memory 224.

The illustrated arrangement of these components is logical; thus the components can be combined or further separated in an actual implementation, and the components can be connected in a variety of ways without changing the basic operation of the system. In some embodiments for example, the controller 212, which may be realized by hardware, software, firmware, or a combination thereof, may be utilized to control both the power supply 202 and switch-mode bias supply 206. In alternative embodiments, however, the power supply 202 and the switch-mode bias supply 206 are realized by completely separated functional units. By way of further example, the controller 212, waveform memory 224, ion energy control portion 220 and the switch-mode bias supply 206 may be integrated into a single component (e.g., residing in a common housing) or may be distributed among discrete components.

The switch-mode bias supply 206 in this embodiment is generally configured to apply a voltage to the support 208 in a controllable manner so as to effectuate a desired distribution of the energies of ions bombarding the surface of the substrate. More specifically, the switch-mode bias supply 206 is configured to effectuate the desired distribution of ion energies by applying one or more particular waveforms at particular power levels to the substrate. And more particularly, responsive to an input from the ion energy control portion 220, the switch-mode bias supply 206 applies particular power levels to effectuate particular ion energies, and applies the particular power levels using one or more voltage waveforms defined by waveform data in the waveform memory 224. As a consequence, one or more particular ion bombardment energies may be selected with the ion control portion to carry out controlled etching of the substrate.

As depicted, the switch-mode power supply 206 includes switch components 226', 226" (e.g., high power field effect transistors) that are adapted to switch power to the support 208 of the substrate 210 responsive to drive signals from corresponding drive components 228', 228". And the drive signals 230', 230" that are generated by the drive components 228', 228" are controlled by the controller 212 based upon timing that is defined by the content of the waveform memory 224. For example, the controller 212 in many embodiments is adapted to interpret the content of the waveform memory and generate drive-control signals 232', 232", which are utilized by the drive components 228', 228" to control the drive signals 230', 230" to the switching components 226', 226". Although two switch components 226', 226", which may be arranged in a half-bridge configuration, are depicted for exemplary purposes, it is certainly contemplated that fewer or additional switch components may be implemented in a variety of architectures (e.g., an H-bridge configuration).

In many modes of operation, the controller 212 (e.g., using the waveform data) modulates the timing of the drive-control signals 232', 232" to effectuate a desired waveform at the support 208 of the substrate 210. In addition, the switch mode bias supply 206 is adapted to supply power to the substrate 210 based upon an ion-energy control signal 234, which may be a DC signal or a time-varying waveform. Thus, the present embodiment enables control of ion distribution energies by controlling timing signals to the switching components and controlling the power (controlled by the ion-energy control component 220) that is applied by the switching components 226', 226".

In addition, the controller 212 in this embodiment is configured, responsive to an arc in the plasma chamber 204 being detected by the arc detection component 222, to carry out arc management functions. In some embodiments, when an arc is detected the controller 212 alters the drive-control signals 232', 232" so that the waveform applied at the output 236 of the switch mode bias supply 206 extinguishes arcs in the plasma 214. In other embodiments, the controller 212 extinguishes arcs by simply interrupting the application of drive-control signals 232', 232" so that the application of power at the output 236 of the switch-mode bias supply 206 is interrupted.

Figure 3:
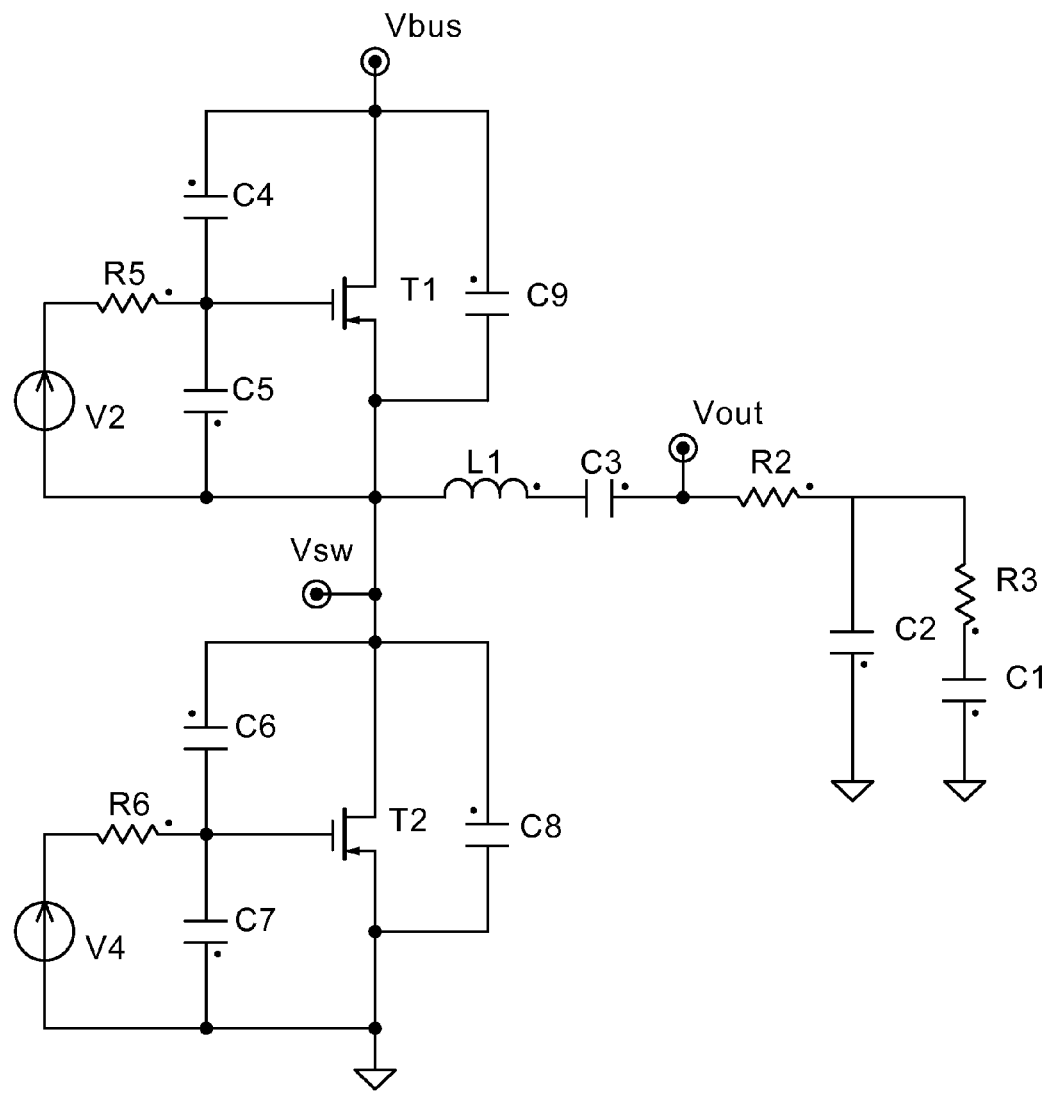
FIG. 3 is a schematic representation of components that may be utilized to realize the switch-mode bias supply described with reference to FIG. 2.

Referring next to FIG. 3, it is a schematic representation of components that may be utilized to realize the switch-mode bias supply 206 described with reference to FIG. 2. As shown, the switching components T1 and T2 in this embodiment are arranged in a half-bridge (also referred to as or totem pole) type topology. Collectively, R2, R3, C1, and C2 represent a plasma load, and C3 is an optional physical capacitor to prevent DC current from the voltage induced on the surface of the substrate or from the voltage of an electrostatic chuck (not shown) from flowing through the circuit. As depicted, L1 is stray inductance (e.g., the natural inductance of the conductor that feeds the power to the load). And in this embodiment, there are three inputs: Vbus, V2, and V4.

V2 and V4 represent drive signals (e.g., the drive signals 230', 230" output by the drive components 228', 228" described with reference to FIG. 2), and in this embodiment, V2 and V4 can be timed (e.g., the length of the pulses and/or the mutual delay) so that the closure of T1 and T2 may be modulated to control the shape of the voltage output at Vout, which is applied to the substrate support. In many implementations, the transistors used to realize the switching components T1 and T2 are not ideal switches, so to arrive at a desired waveform, the transistor-specific characteristics are taken into consideration. In many modes of operation, simply changing the timing of V2 and V4 enables a desired waveform to be applied at Vout.

For example, the switches T1, T2 may be operated so that the voltage at the surface of the substrate 110, 210 is generally negative with periodic voltage pulses approaching and/or slightly exceeding a positive voltage reference. The value of the voltage at the surface of the substrate 110, 210 is what defines the energy of the ions, which may be characterized in terms of an ion energy distribution function (IEDF). To effectuate desired voltage(s) at the surface of the substrate 110, 210, the pulses at Vout may be generally rectangular and have a width that is long enough to induce a brief positive voltage at the surface of the substrate 110, 210 so as to attract enough electrons to the surface of the substrate 110, 210 in order to achieve the desired voltage(s) and corresponding ion energies.

Vbus in this embodiment defines the amplitude of the pulses applied to Vout, which defines the voltage at the surface of the substrate, and as a consequence, the ion energy. Referring briefly again to FIG. 2, Vbus may be coupled to the ion energy control portion, which may be realized by a DC power supply that is adapted to apply a DC signal or a time-varying waveform to Vbus.

Figure 4:
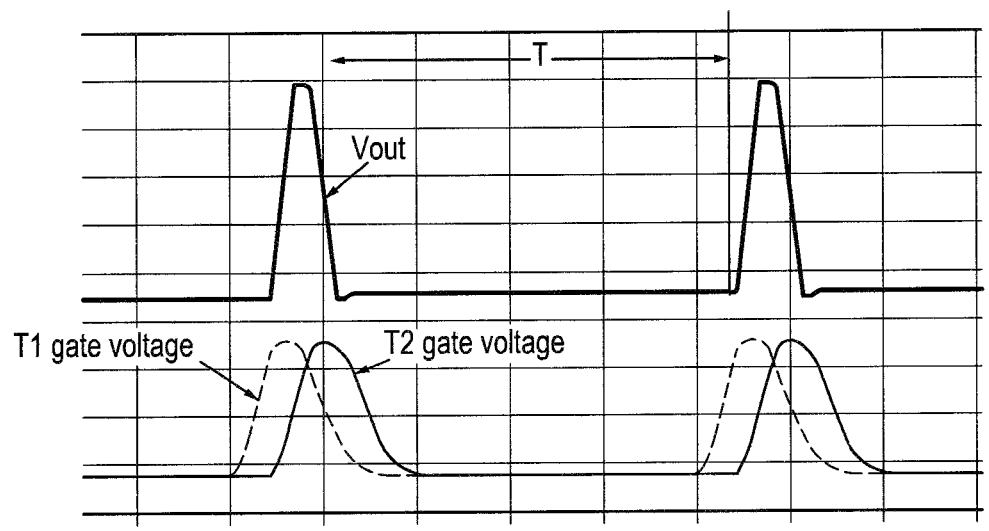
FIG. 4 is a timing diagram depicting two drive signal waveforms.

The pulse width, pulse shape, and/or mutual delay of the two signals V2, V4 may be modulated to arrive at a desired waveform at Vout, and the voltage applied to Vbus may affect the characteristics of the pulses. In other words, the voltage Vbus may affect the pulse width, pulse shape and/or the relative phase of the signals V2, V4. Referring briefly to FIG. 4, for example, shown is a timing diagram depicting two drive signal waveforms that may be applied to T1 and T2 (as V2 and V4) so as to generate the period voltage function at Vout as depicted in FIG. 4. To modulate the shape of the pulses at Vout (e.g. to achieve the smallest time for the pulse at Vout, yet reach a peak value of the pulses) the timing of the two gate drive signals V2, V4 may be controlled.

For example, the two gate drive signals V2, V4 may be applied to the switching components T1, T2 so the time that each of the pulses is applied at Vout may be short compared to the time T between pulses, but long enough to induce a positive voltage at the surface of the substrate 110, 210 to attract electrons to the surface of the substrate 110, 210. Moreover, it has been found that by changing the gate voltage level between the pulses, it is possible to control the slope of the voltage that is applied to Vout between the pulses (e.g., to achieve a substantially constant voltage at the surface of the substrate between pulses). In some modes of operation, the repetition rate of the gate pulses is about 400 kHz, but this rate may certainly vary from application to application.

Although not required, in practice, based upon modeling and refining upon actual implementation, waveforms that may be used to generate the desired ion energy distributions may be defined, and the waveforms can be stored (e.g., in the waveform memory portion described with reference to FIG. 1 as a sequence of voltage levels). In addition, in many implementations, the waveforms can be generated directly (e.g., without feedback from Vout); thus avoiding the undesirable aspects of a feedback control system (e.g., settling time).

Figure 5:
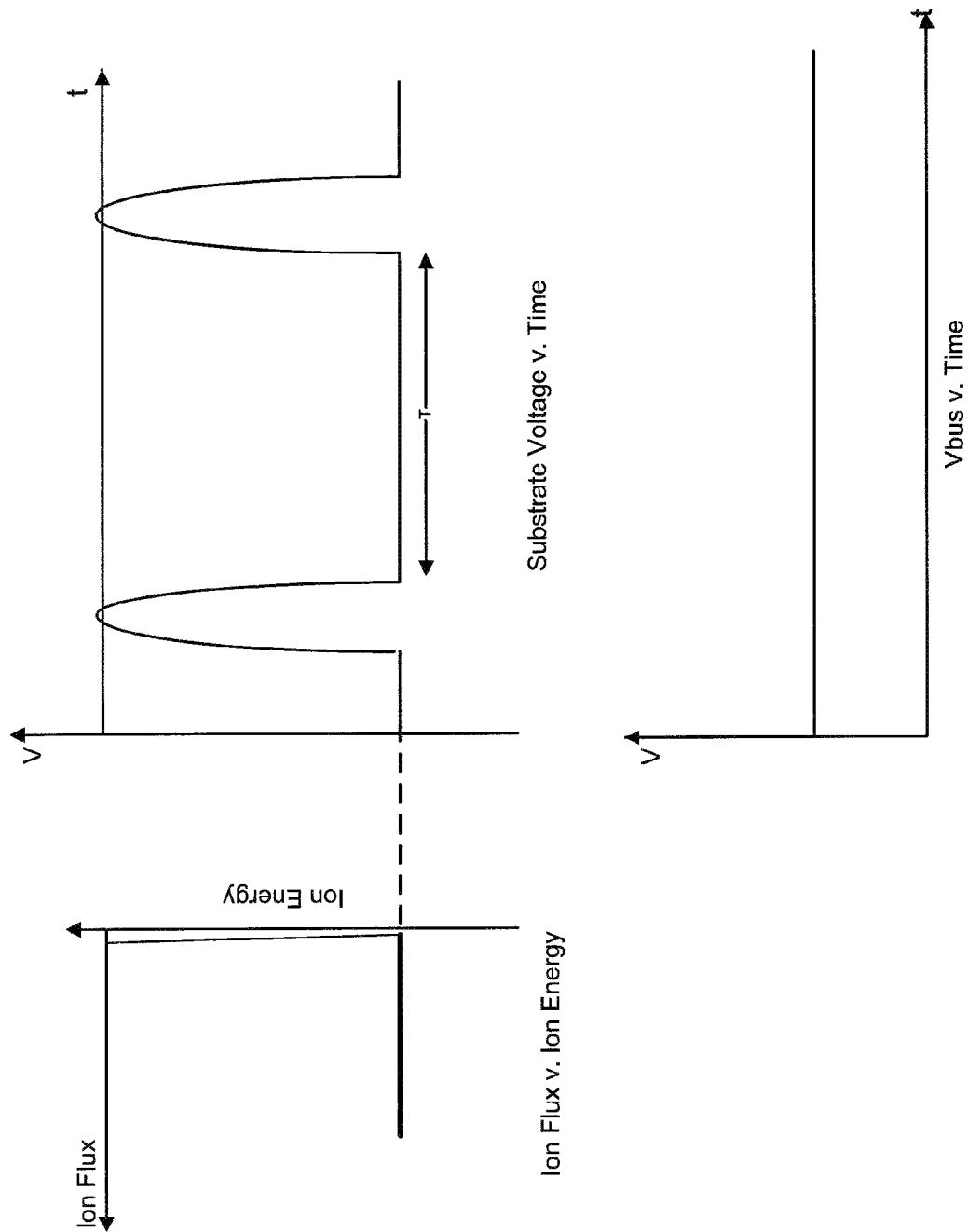
FIG. 5 is a graphical representation of a single mode of operating the switch mode bias supply, which effectuates an ion energy distribution that is concentrated at a particular ion energy.

Referring again to FIG. 3, Vbus can be modulated to control the energy of the ions, and the stored waveforms may be used to control the gate drive signals V2, V4 to achieve a desired pulse amplitude at Vout while minimizing the pulse width. Again, this is done in accordance with the particular characteristics of the transistors, which may be modeled or implemented and empirically established. Referring to FIG. 5, for example, shown are graphs depicting Vbus versus time, voltage at the surface of the substrate 110, 210 versus time, and the corresponding ion energy distribution.

The graphs in FIG. 5 depict a single mode of operating the switch mode bias supply 106, 206, which effectuates an ion energy distribution that is concentrated at a particular ion energy. As depicted, to effectuate the single concentration of ion energies in this example, the voltage applied at Vbus is maintained constant while the voltages applied to V2 and V4 are controlled (e.g., using the drive signals depicted in FIG. 3) so as to generate pulses at the output of the switch-mode bias supply 106, 206, which effectuates the corresponding ion energy distribution shown in FIG. 5.

As depicted in FIG. 5, the potential at the surface of the substrate 110, 210 is generally negative to attract the ions that bombard and etch the surface of the substrate 110, 210. The periodic short pulses that are applied to the substrate 110, 210 (by applying pulses to Vout) have a magnitude defined by the potential that is applied to Vbus, and these pulses cause a brief change in the potential of the substrate 110, 210 (e.g., close to positive or slightly positive potential), which attracts electrons to the surface of the substrate to achieve the generally negative potential along the surface of the substrate 110, 210. As depicted in FIG. 5, the constant voltage applied to Vbus effectuates a single concentration of ion flux at particular ion energy; thus a particular ion bombardment energy may be selected by simply setting Vbus to a particular potential. In other modes of operation, two or more separate concentrations of ion energies may be created.

Figure 6:
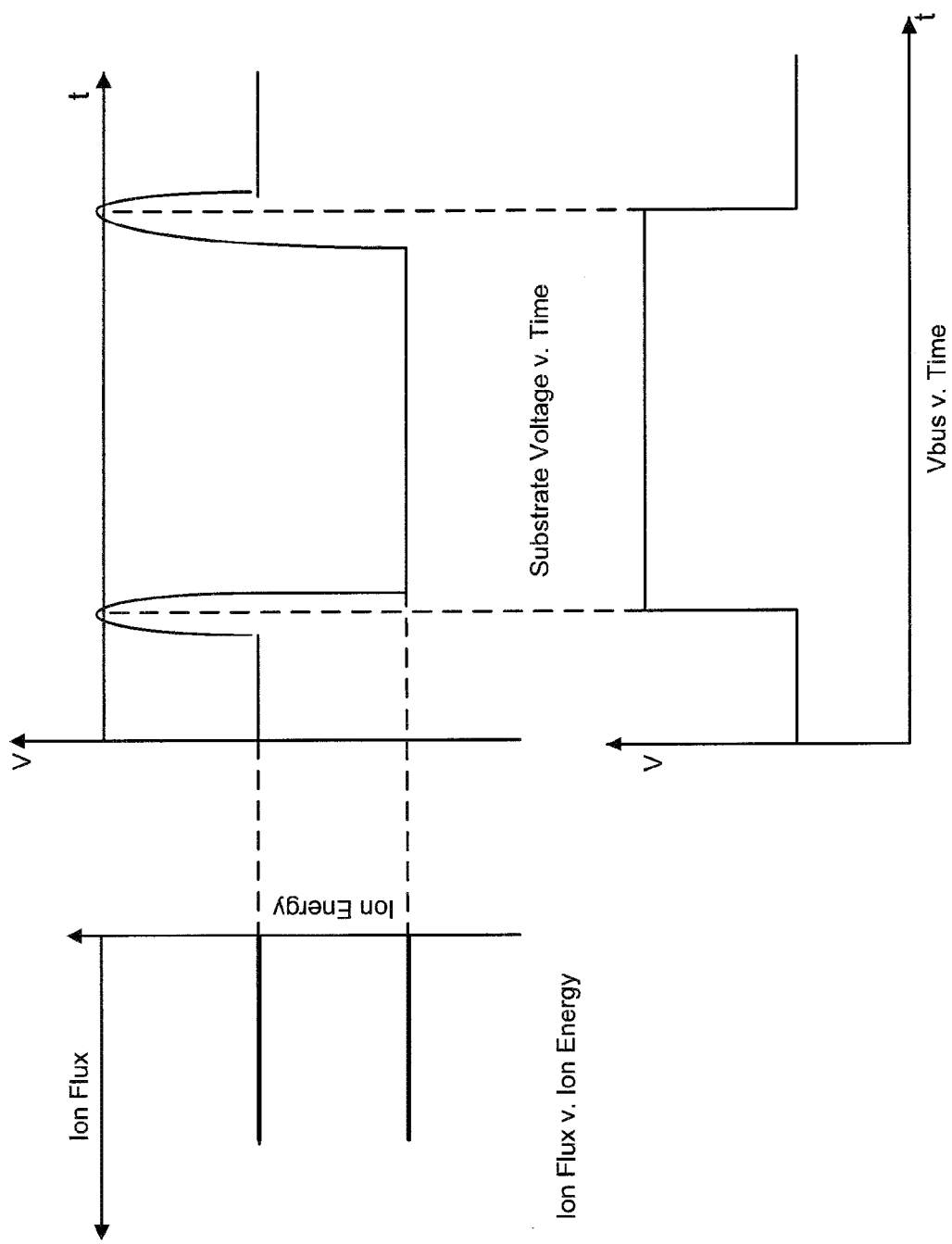
FIG. 6 are graphs depicting a bi-modal mode of operation in which two separate peaks in ion energy distribution are generated.

Referring next to FIG. 6, for example, shown are graphs depicting a bi-modal mode of operation in which two separate peaks in ion energy distribution are generated. As shown, in this mode of operation, the substrate experiences two distinct levels of voltages and periodic pulses, and as a consequence, two separate concentrations of ion energies are created. As depicted, to effectuate the two distinct ion energy concentrations, the voltage that is applied at Vbus alternates between two levels, and each level defines the energy level of the two ion energy concentrations.

Although FIG. 6 depicts the two voltages at the substrate 110, 210 as alternating after every pulse, this is certainly not required. In other modes of operation for example, the voltages applied to V2 and V4 are switched (e.g., using the drive signals depicted in FIG. 3) relative to the voltage applied to Vout so that the induced voltage at surface of the substrate alternates from a first voltage to a second voltage (and vice versa) after two or more pulses.

In prior art techniques, attempts have been made to apply the combination of two waveforms (generated by waveform generators) to a linear amplifier and apply the amplified combination of the two waveforms to the substrate in order to effectuate multiple ion energies. This approach, however, is much more complex then the approach described with reference to FIG. 6, and requires an expensive linear amplifier, and waveform generators.

Figure 7A:
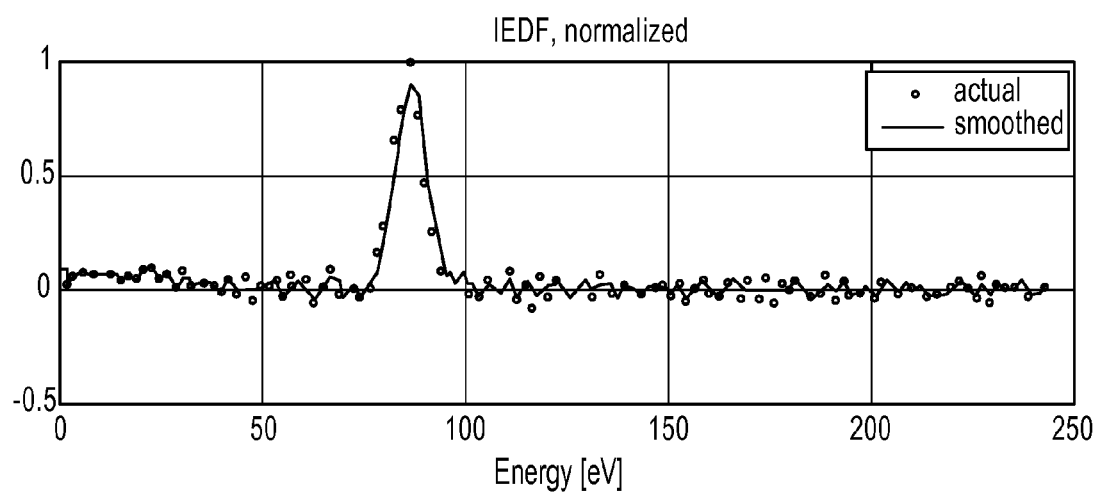
FIGS. 7A and 7B are is are graphs depicting actual, direct ion energy measurements made in a plasma.
Figure 7B:
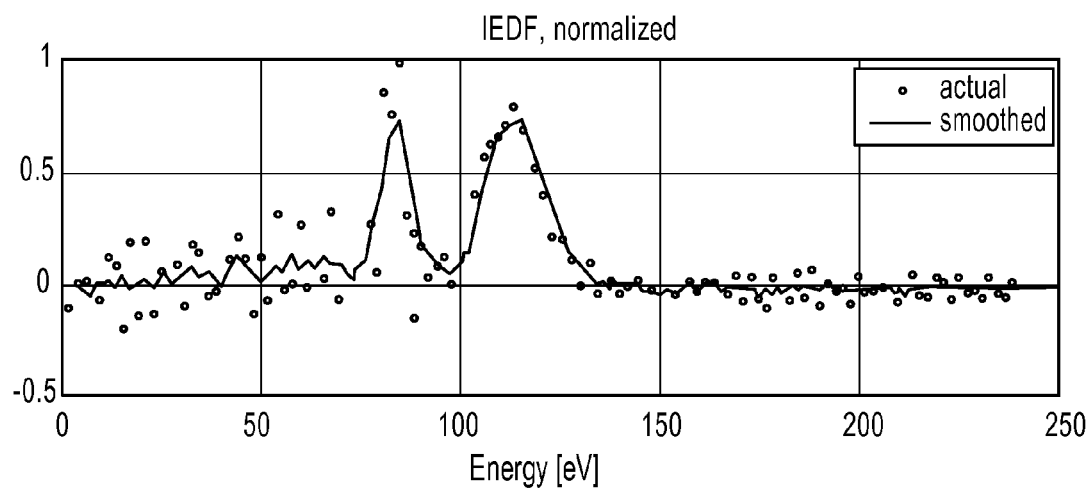

Referring next to FIGS. 7A and 7B, shown are graphs depicting actual, direct ion energy measurements made in a plasma corresponding to monoenergetic and dual-level regulation of the DC voltage applied to Vbus, respectively. As depicted in FIG. 7A, the ion energy distribution is concentrated around 80 eV responsive to a non-varying application of a voltage to Vbus (e.g., as depicted in FIG. 5). And in FIG. 7B, two separate concentrations of ion energies are present at around 85 eV and 115 eV responsive to a dual-level regulation of Vbus (e.g., as depicted in FIG. 6).

Figure 8:
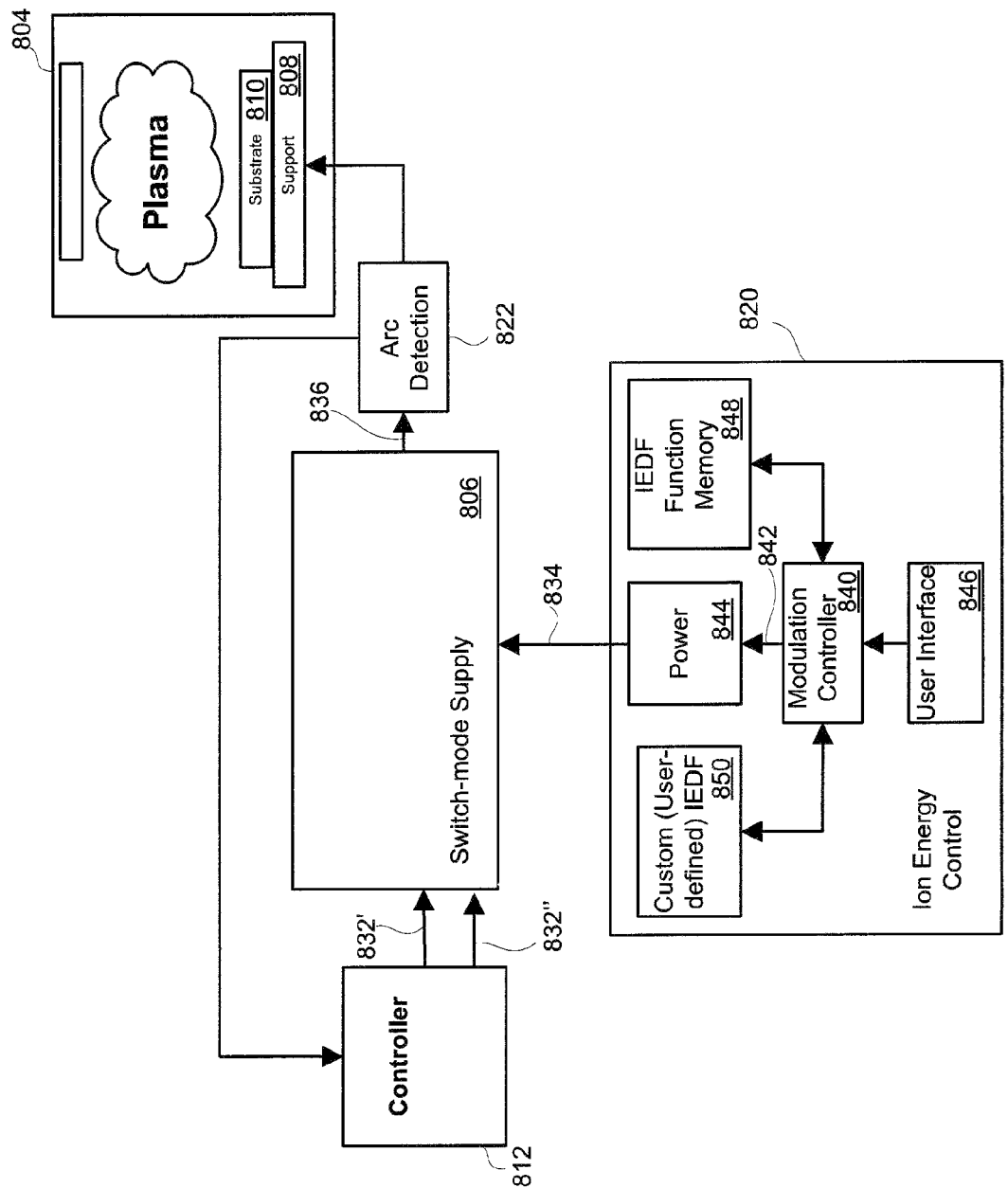
FIG. 8 is a block diagram depicting another embodiment of the present invention.

Referring next to FIG. 8, shown is a block diagram depicting another embodiment of the present invention. As depicted, a switch-mode power supply 806 is coupled to a controller 812, an ion-energy control component 820, and a substrate support 808 via an arc detection component 822. The controller 812, switch-mode supply 806, and ion energy control component 820 collectively operate to apply power to the substrate support 808 so as to effectuate, on a time-averaged basis, a desired ion energy distribution at the surface of the substrate 810.

Figure 9A:
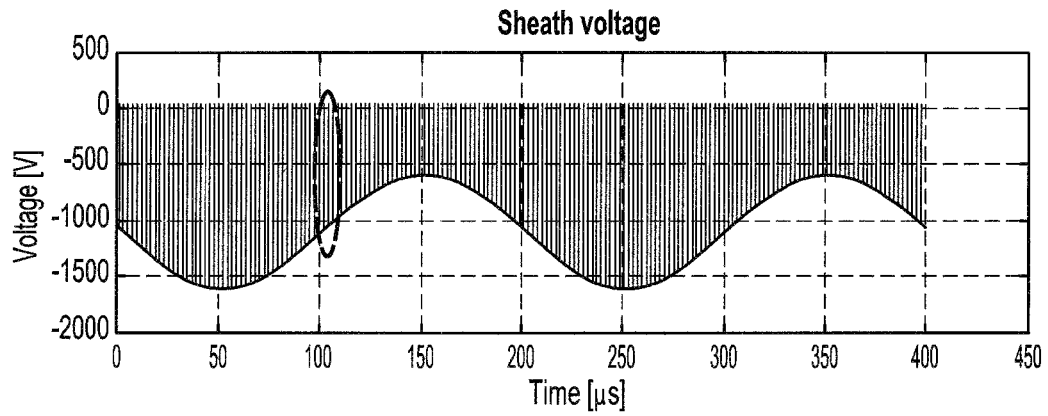
FIG. 9A is a graph depicting an exemplary periodic voltage function that is modulated by a sinusoidal modulating function.
Figure 9B:
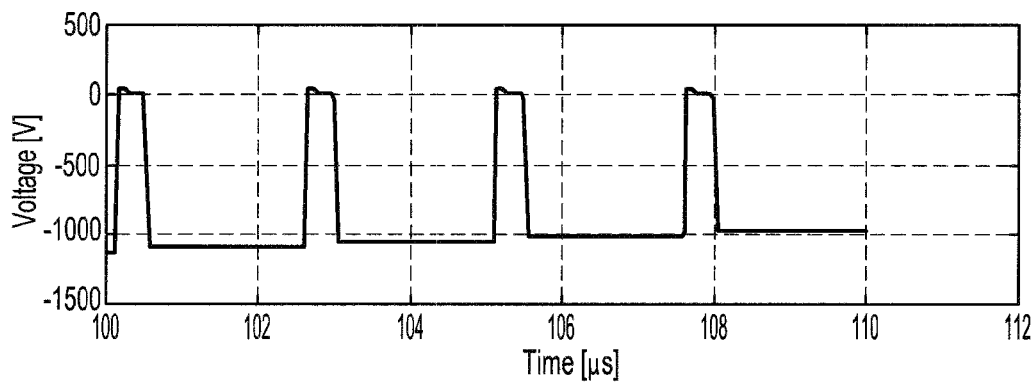
FIG. 9B is an exploded view of a portion of the periodic voltage function that is depicted in FIG. 9A.
Figure 9C:
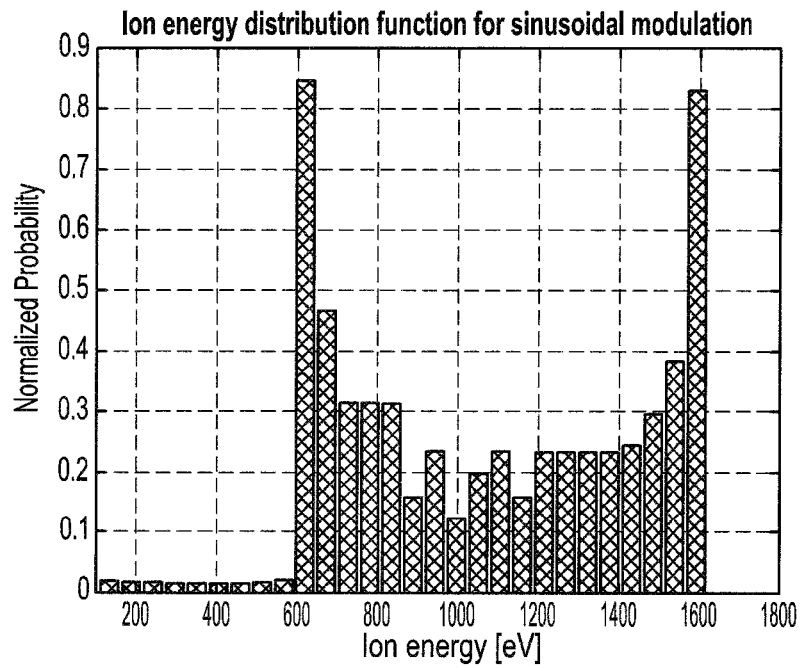
FIG. 9C depicts the resulting distribution of ion energies, on time-averaged basis, that results from the sinusoidal modulation of the periodic voltage function.
Figure 9D:
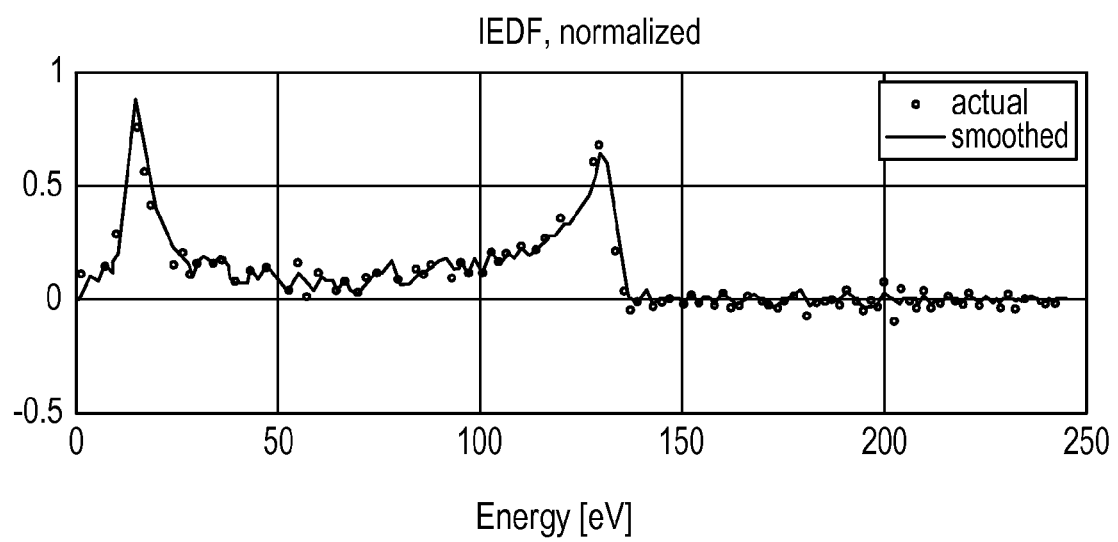
FIG. 9D depicts actual, direct, ion energy measurements made in a plasma of a resultant, time averaged, IEDF when a periodic voltage function is modulated by a sinusoidal modulating function.

Referring briefly to FIG. 9A for example, shown is a periodic voltage function with a frequency of about 400 kHz that is modulated by a sinusoidal modulating function of about 5 kHz over multiple cycles of the periodic voltage function. FIG. 9B is an exploded view of the portion of the periodic voltage function that is circled in FIG. 9A, and FIG. 9C depicts the resulting distribution of ion energies, on a time-averaged basis, that results from the sinusoidal modulation of the periodic voltage function. And FIG. 9D depicts actual, direct, ion energy measurements made in a plasma of a resultant, time-averaged, IEDF when a periodic voltage function is modulated by a sinusoidal modulating function. As discussed further herein, achieving a desired ion energy distribution, on a time-averaged basis, may be achieved by simply changing the modulating function that is applied to the periodic voltage.

Figure 10A:
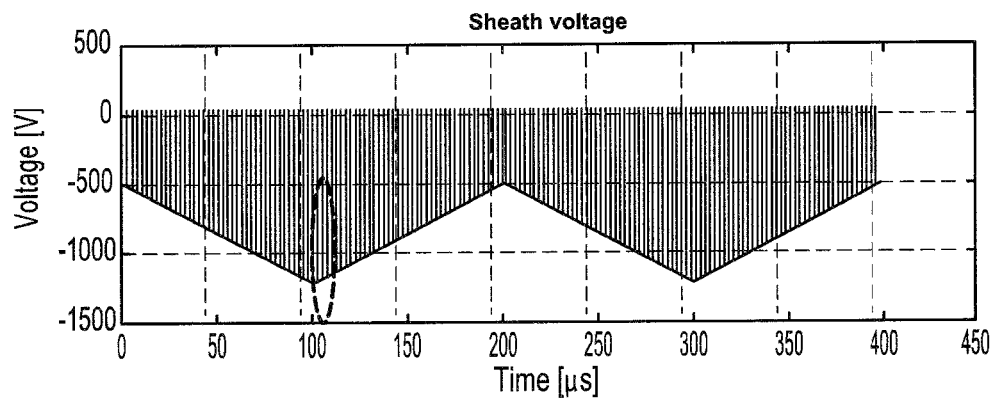
FIG. 10A depicts a periodic voltage function is modulated by a sawtooth modulating function.
Figure 10B:
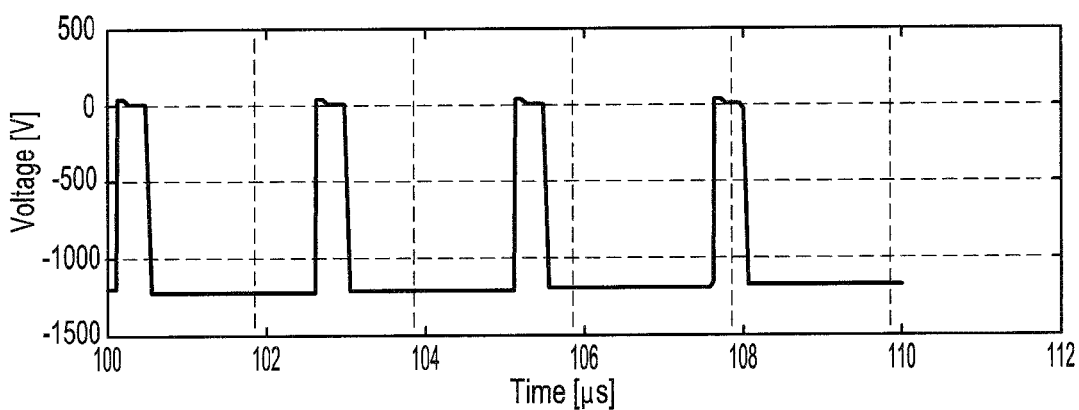
FIG. 10B is an exploded view of a portion of the periodic voltage function that is depicted in FIG. 10A.
Figure 10C:
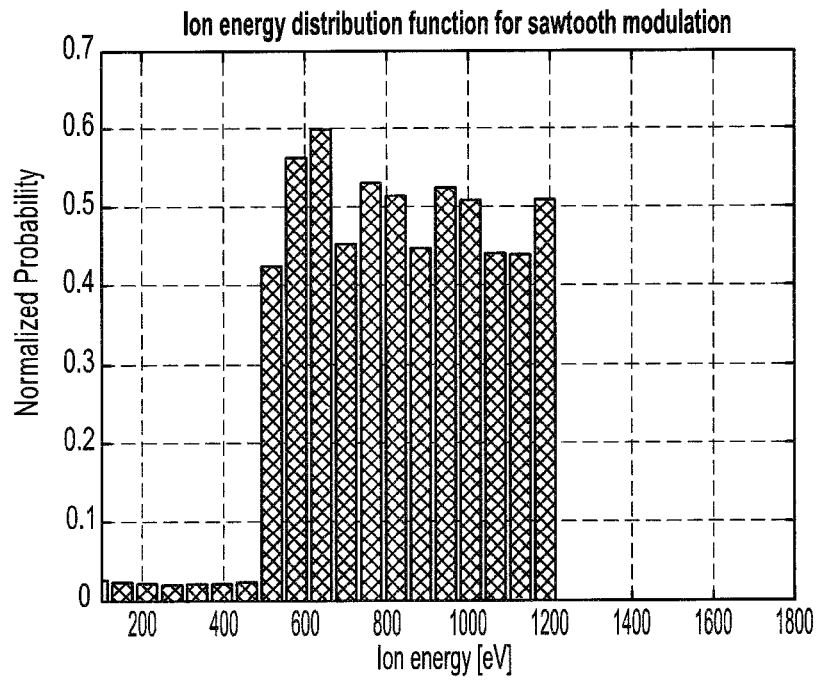
FIG. 10C is a graph depicting the resulting distribution of ion energies, on a time averaged basis, that results from the sinusoidal modulation of the periodic voltage function in FIGS. 10A and 10B.

Referring to FIGS. 10A and 10B as another example, a 400 kHz periodic voltage function is modulated by a sawtooth modulating function of approximately 5 kHz to arrive at the distribution of ion energies depicted in FIG. 10C on a time-averaged basis. As depicted, the periodic voltage function utilized in connection with FIG. 10 is the same as in FIG. 9, except that the periodic voltage function in FIG. 10 is modulated by a sawtooth function instead of a sinusoidal function.

It should be recognized that the ion energy distribution functions depicted in FIGS. 9C and 10C do not represent an instantaneous distribution of ion energies at the surface of the substrate 810, but instead represent the time average of the ion energies. With reference to FIG. 9C, for example, at a particular instant in time, the distribution of ion energies will be a subset of the depicted distribution of ion energies that exist over the course of a full cycle of the modulating function.

It should also be recognized that the modulating function need not be a fixed function nor need it be a fixed frequency. In some instances for example, it may be desirable to modulate the periodic voltage function with one or more cycles of a particular modulating function to effectuate a particular, time-averaged ion energy distribution, and then modulate the periodic voltage function with one or more cycles of another modulating function to effectuate another, time-averaged ion energy distribution. Such changes to the modulating function (which modulates the periodic voltage function) may be beneficial in many instances. For example, if a particular distribution of ion energies is needed to etch a particular geometric construct or to etch through a particular material, a first modulating function may be used, and then another modulating function may subsequently be used to effectuate a different etch geometry or to etch through another material.

Similarly, the periodic voltage function (e.g., the 400 kHz components in FIGS. 9A, 9B, 10A, and 10B and Vout in FIG. 4) need not be rigidly fixed (e.g., the shape and frequency of the periodic voltage function may vary), but generally its frequency is established by the transit time of ions within the chamber so that ions in the chamber are affected by the voltage that is applied to the substrate 810.

Referring back to FIG. 8, the controller 812 provides drive-control signals 832', 832" to the switch-mode supply 806 so that the switch-mode supply 806 generates a periodic voltage function. The switch mode supply 806 may be realized by the components depicted in FIG. 3 (e.g., to create a periodic voltage function depicted in FIG. 4), but it is certainly contemplated that other switching architectures may be utilized.

In general, the ion energy control component 820 functions to apply a modulating function to the periodic voltage function (that is generated by the controller 812 in connection with the switch mode power supply 806). As shown in FIG. 8, the ion energy control component 820 includes a modulation controller 840 that is in communication with a custom IEDF portion 850, an IEDF function memory 848, a user interface 846, and a power component 844. It should be recognized that the depiction of these components is intended to convey functional components, which in reality, may be effectuated by common or disparate components.

The modulation controller 840 in this embodiment generally controls the power component 844 (and hence its output 834) based upon data that defines a modulation function, and the power component 844 generates the modulation function 834 (based upon a control signal 842 from the modulation controller 840) that is applied to the periodic voltage function that is generated by the switch-mode supply 806. The user interface 846 in this embodiment is configured to enable a user to select a predefined IEDF function that is stored in the IEDF function memory 848, or in connection with the custom IEDF component 850, define a custom IEDF In many implementations, the power component 844 includes a DC power supply (e.g., a DC switch mode power supply or a linear amplifier), which applies the modulating function (e.g. a varying DC voltage) to the switch mode power supply (e.g., to Vbus of the switch mode power supply depicted in FIG. 3). In these implementations, the modulation controller 840 controls the voltage level that is output by the power component 844 so that the power component 844 applies a voltage that conforms to the modulating function.

Figure 11:
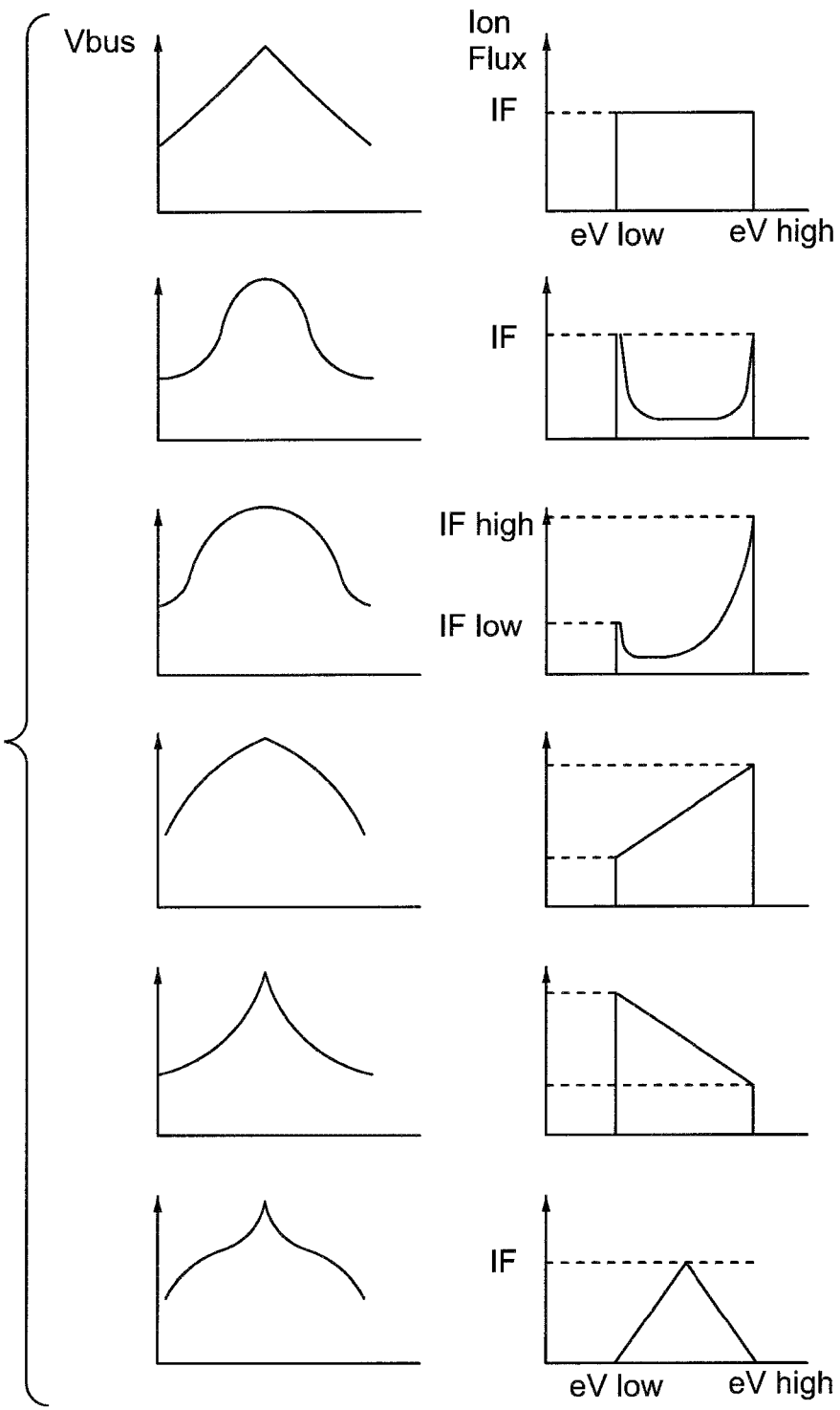
FIG. 11 are graphs showing IEDF functions in the right column and associated modulating functions in the left column.

In some implementations, the IEDF function memory 848 includes a plurality of data sets that correspond to each of a plurality of IEDF distribution functions, and the user interface 846 enables a user to select a desired IEDF function. Referring to FIG. 11 for example, shown in the right column are exemplary IEDF functions that may be available for a user to select. And the left column depicts the associated modulating function that the modulation controller 840 in connection with the power component 844 would apply to the periodic voltage function to effectuate the corresponding IEDF function. It should be recognized that the IEDF functions depicted in FIG. 11 are only exemplary and that other IEDF functions may be available for selection.

The custom IEDF component 850 generally functions to enable a user, via the user interface 846, to define a desired ion energy distribution function. In some implementations for example, the custom IEDF component 850 enables a user to establish values for particular parameters that define a distribution of ion energies.

For example, the custom IEDF component 850 may enable IEDF functions to be defined in terms of a relative level of flux (e.g., in terms of a percentage of flux) at a high-level (IF-high), a mid-level (IF-mid), and a low level (IF-low) in connection with a function(s) that defines the IEDF between these energy levels. In many instances, only IF-high, IF-low, and the IEDF function between these levels is sufficient to define an IEDF function. As a specific example, a user may request 1200 eV at a 20% contribution level (contribution to the overall IEDF), 700 eV at a 30% contribution level with a sinusoid IEDF between these two levels.

It is also contemplated that the custom IEDF portion 850 may enable a user to populate a table with a listing of one or more (e.g., multiple) energy levels and the corresponding percentage contribution of each energy level to the IEDF. And in yet alternative embodiments, it is contemplated that the custom IEDF component 850 in connection with the user interface 846 enables a user to graphically generate a desired IEDF by presenting the user with a graphical tool that enables a user to draw a desired IEDF.

In addition, it is also contemplated that the IEDF function memory 848 and the custom IEDF component 850 may interoperate to enable a user to select a predefined IEDF function and then alter the predefined IEDF function so as to produce a custom IEDF function that is derived from the predefined IEDF function.

Once an IEDF function is defined, the modulation controller 840 translates data that defines the desired IEDF function into a control signal 842, which controls the power component 844 so that the power component 844 effectuates the modulation function that corresponds to the desired IEDF. For example, the control signal 842 controls the power component 844 so that the power component 844 outputs a voltage that is defined by the modulating function.

Figure 12:
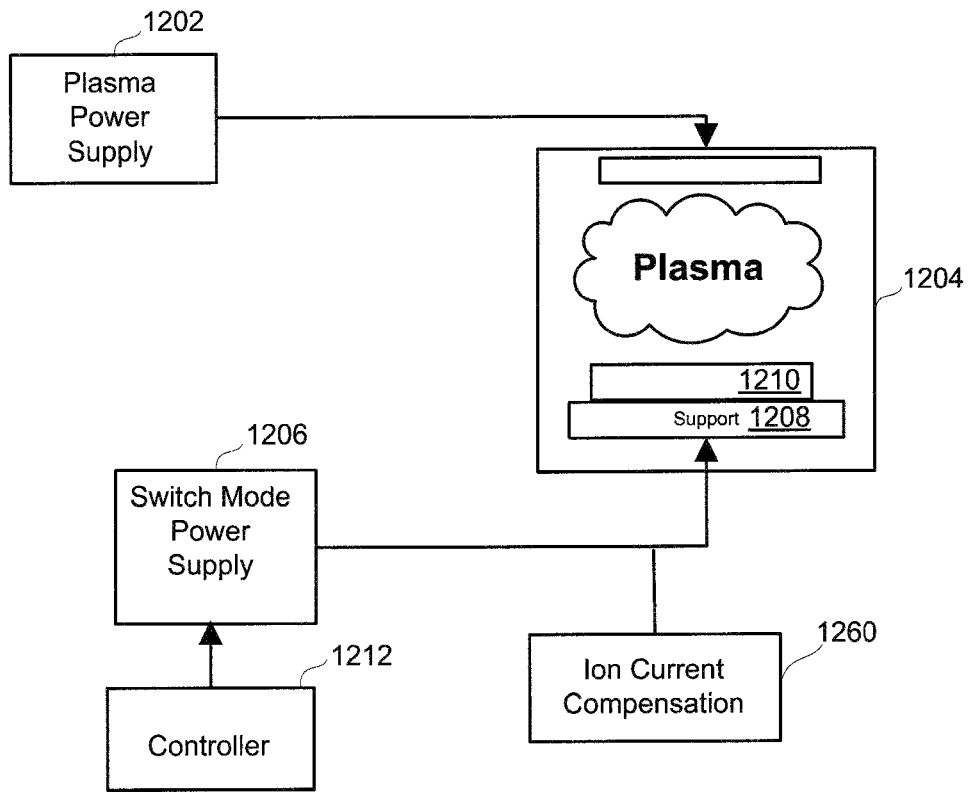
FIG. 12 is a block diagram depicting an embodiment in which an ion current compensation component compensates for ion current in a plasma chamber.
Figure 15A:
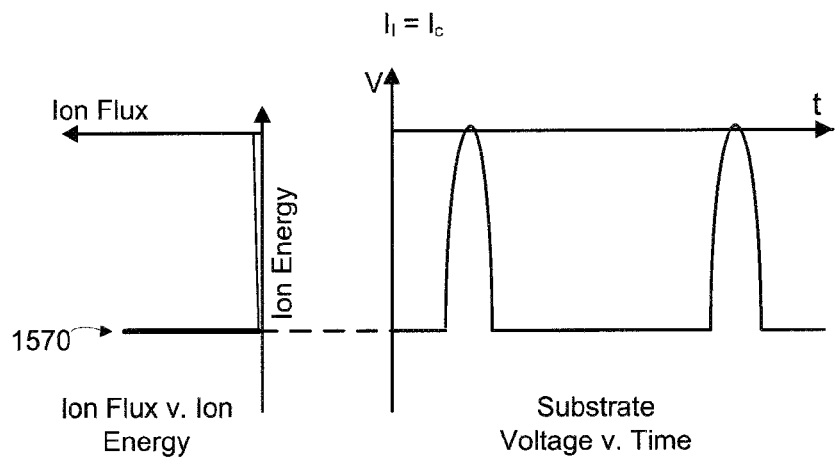
FIGS. 15A-15C are voltage waveforms as appearing at the surface of the substrate or wafer responsive to compensation current.
Figure 15B:
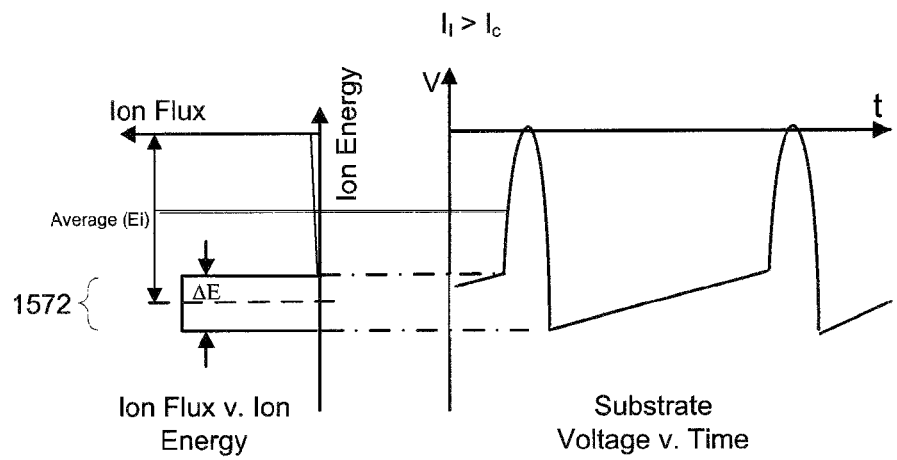
Figure 15C:
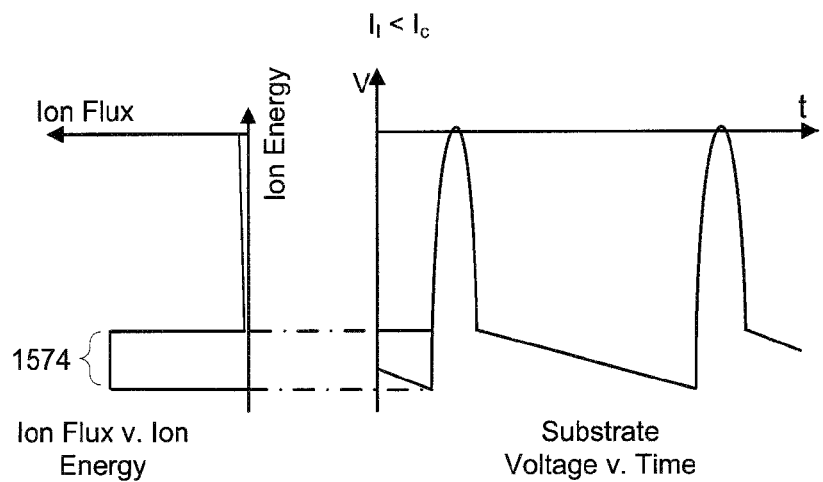

Referring next to FIG. 12, it is a block diagram depicting an embodiment in which an ion current compensation component 1260 compensates for ion current in the plasma chamber 1204. Applicants have found that, at higher energy levels, higher levels of ion current within the chamber affect the voltage at the surface of the substrate, and as a consequence, the ion energy distribution is also affected. Referring briefly to FIGS. 15A-15C for example, shown are voltage waveforms as they appear at the surface of the substrate 1210 or wafer and their relationship to IEDF.

More specifically, FIG. 15A depicts a periodic voltage function at the surface of the substrate 1210 when ion current $I_I$ is equal to compensation current Ic; FIG. 15B depicts the voltage waveform at the surface of the substrate 1210 when ion current $I_I$ is greater than the compensation current Ic; and FIG. 15C depicts the voltage waveform at the surface of the substrate when ion current is less than the compensation current Ic.

As depicted in FIG. 15A, when $I_I$=Ic a spread of ion energies 1470 is relatively narrow as compared to a uniform spread 1472 of ion energies when $I_I$>Ic as depicted in FIG. 15B or a uniform spread 1474 of ion energies when $I_I$<Ic as depicted in FIG. 15C. Thus, the ion current compensation component 1260 enables a narrow spread of ion energies when the ion current is high (e.g., by compensating for effects of ion current), and it also enables a width of the spread 1572, 1574 of uniform ion energy to be controlled (e.g., when it is desirable to have a spread of ion energies).

As depicted in FIG. 15B, without ion current compensation (when $I_I$>Ic) the voltage at the surface of the substrate, between the positive portions of the periodic voltage function, becomes less negative in a ramp-like manner, which produces a broader spread 1572 of ion energies. Similarly, when ion current compensation is utilized to increase a level of compensation current to a level that exceeds the ion current ($I_I$<Ic) as depicted in FIG. 15C, the voltage at the surface of the substrate becomes more negative in a ramp-like manner between the positive portions of the periodic voltage function, and a broader spread 1574 of uniform ion energies is produced.

Referring back to FIG. 12, the ion compensation component 1260 may be realized as a separate accessory that may optionally be added to the switch mode power supply 1206 and controller 1212. In other embodiments, (e.g., as depicted in FIG. 13) the ion current compensation component 1260 may share a common housing 1366 with other components described herein (e.g., the switch-mode power supply 106, 206, 806, 1206 and ion energy control 220, 820 components).

Figure 13:
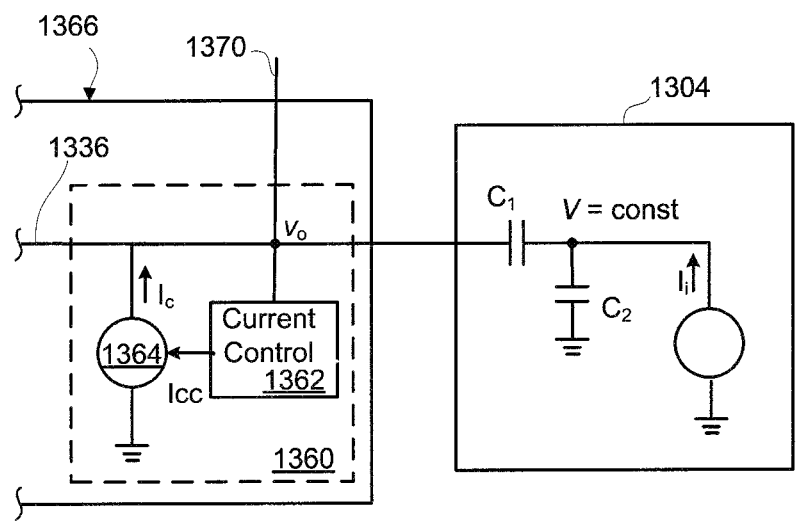
FIG. 13 is a diagram depicting an exemplary ion current compensation component.

As depicted in FIG. 13, shown is an exemplary ion current compensation component 1360 that includes a current source 1364 coupled to an output 1336 of a switch mode supply and a current controller 1362 that is coupled to both the current source 1364 and the output 1336. Also depicted in FIG. 13 is a plasma chamber 1304, and within the plasma chamber are capacitive elements $C_1$, $C_2$, and ion current $I_I$ As depicted, $C_1$ represents the inherent capacitance of components associated with the chamber 1304, which may include insulation, the substrate, substrate support, and an echuck, and $C_2$ represents sheath capacitance and stray capacitances.

It should be noted that because $C_1$ in this embodiment is an inherent capacitance of components associated with the chamber 1304, it is not an accessible capacitance that is added to gain control of processing. For example, some prior art approaches that utilize a linear amplifier couple bias power to the substrate with a blocking capacitor, and then utilize a monitored voltage across the blocking capacitor as feedback to control their linear amplifier. Although a capacitor could couple a switch mode power supply to a substrate support in many of the embodiments disclosed herein, it is unnecessary to do so because feedback control using a blocking capacitor is not required in several embodiments of the present invention.

Figure 14:
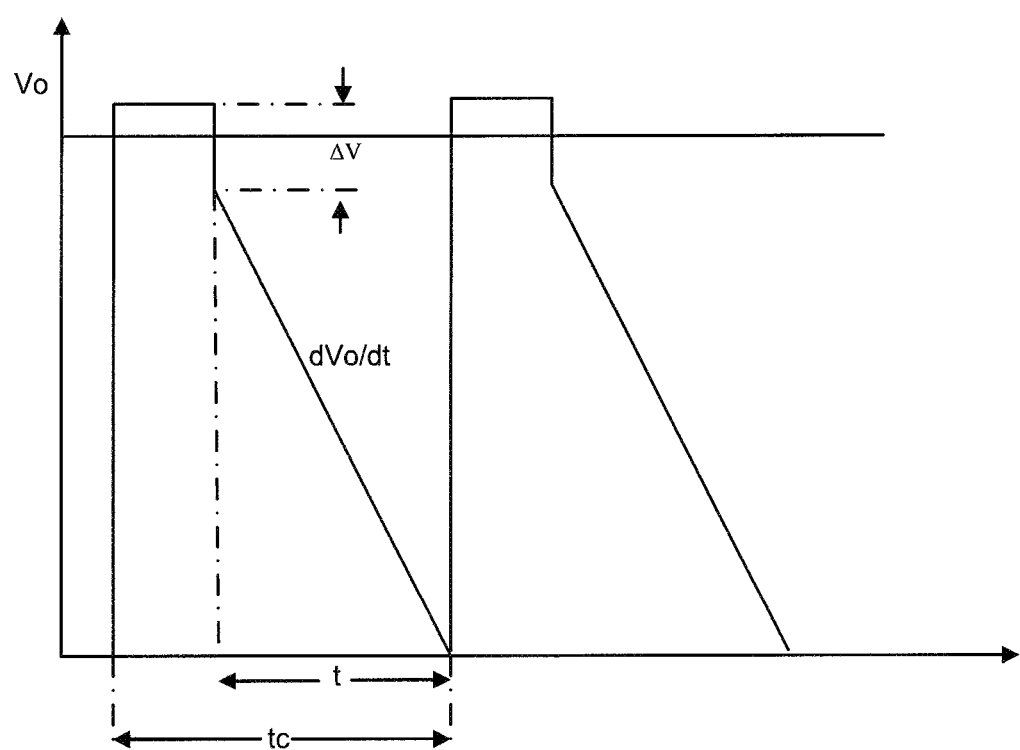
FIG. 14 is a graph depicting an exemplary voltage at node Vo depicted in FIG. 13.

While referring to FIG. 13, simultaneous reference is made to FIG. 14, which is a graph depicting an exemplary voltage at Vo depicted in FIG. 13. In operation, the current controller 1362 monitors the voltage at Vo, and ion current is calculated over an interval t (depicted in FIG. 14) as:

$$I_I = C_1 \frac{dVo}{dt}$$

Because $C_1$ is substantially constant for a given tool and is measurable, only Vo needs to be monitored to enable ongoing control of compensation current. As discussed above, to obtain a more mono-energetic distribution of ion energy (e.g., as depicted in FIG. 15A) the current controller controls the current source 1364 so that Ic is substantially the same as $I_I$. In this way, a narrow spread of ion energies may be maintained even when the ion current reaches a level that affects the voltage at the surface of the substrate. And in addition, if desired, the spread of the ion energy may be controlled as depicted in FIGS. 15B and 15C so that additional ion energies are realized at the surface of the substrate.

Also depicted in FIG. 13 is a feedback line 1370, which may be utilized in connection with controlling an ion energy distribution. For example, the value of ΔV depicted in FIG. 14, is indicative of instantaneous ion energy and may be used in many embodiments as part of a feedback control loop.

Figure 16:
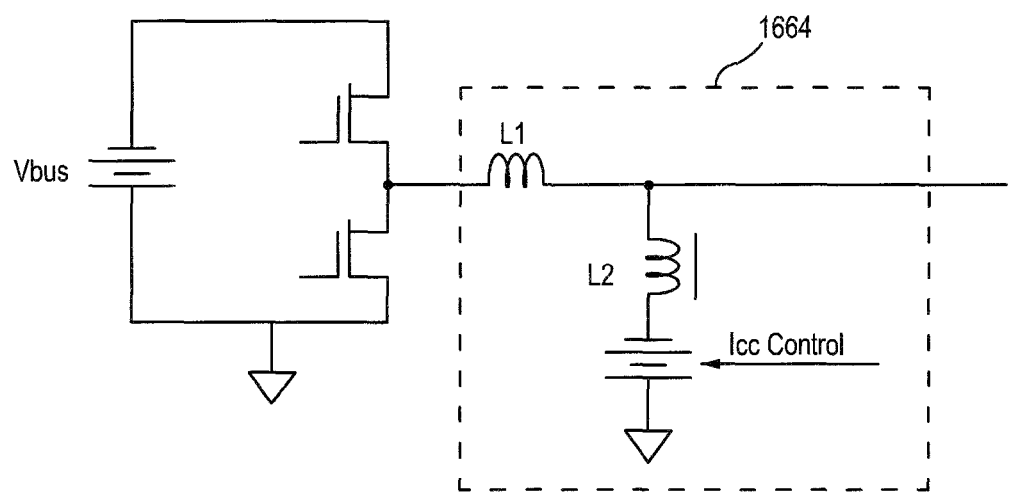
FIG. 16 is an exemplary embodiment of a current source, which may be implemented to realize the current source described with reference to FIG. 13.

Referring next to FIG. 16, shown is an exemplary embodiment of a current source 1664, which may be implemented to realize the current source 1364 described with reference to FIG. 13. In this embodiment, a controllable negative DC voltage source, in connection with a series inductor L2, function as a current source, but one of ordinary skill in the art will appreciate, in light of this specification, that a current source may be realized by other components and/or configurations.

Figure 17A:
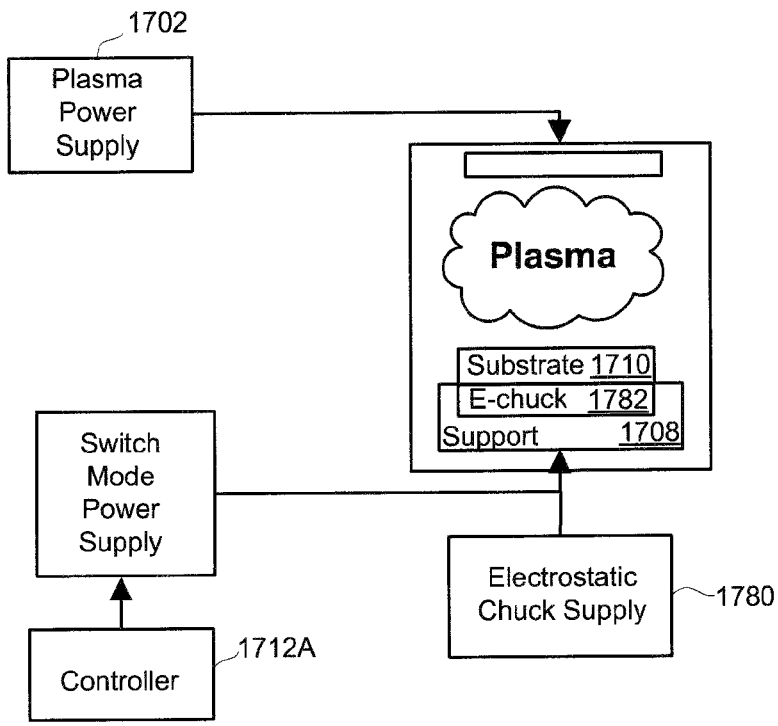
FIGS. 17A and 17B are block diagrams depicting other embodiments of the present invention.
Figure 17B:
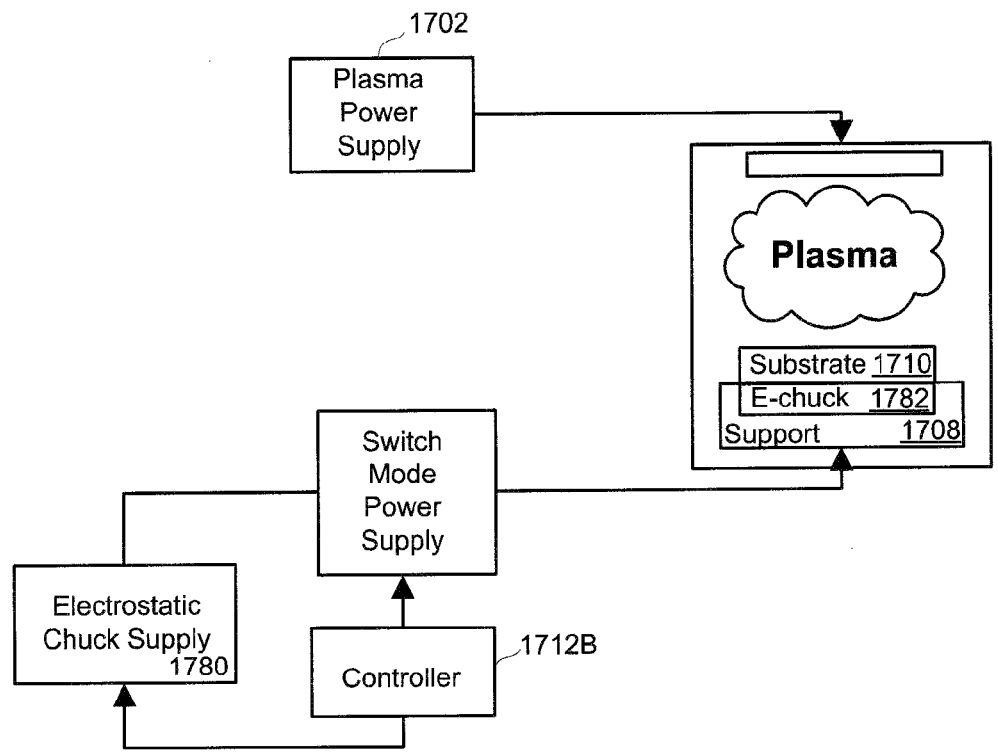

Referring next to FIGS. 17A and 17B, shown are block diagrams depicting other embodiments of the present invention. As shown, the substrate support 1708 in these embodiments includes an electrostatic chuck 1782, and an electrostatic chuck supply 1780 is utilized to apply power to the electrostatic chuck 1782. In some variations, as depicted in FIG. 17A, the electrostatic chuck supply 1780 is positioned to apply power directly to the substrate support 1708, and in other variations, the electrostatic chuck supply 1780 is positioned to apply power in connection with the switch mode power supply. It should be noted that serial chucking can be carried by either a separate supply or by use of the controller to effect a net DC chucking function. In this DC-coupled (e.g., no blocking capacitor), series chucking function, the undesired interference with other RF sources can be minimized.

Figure 18:
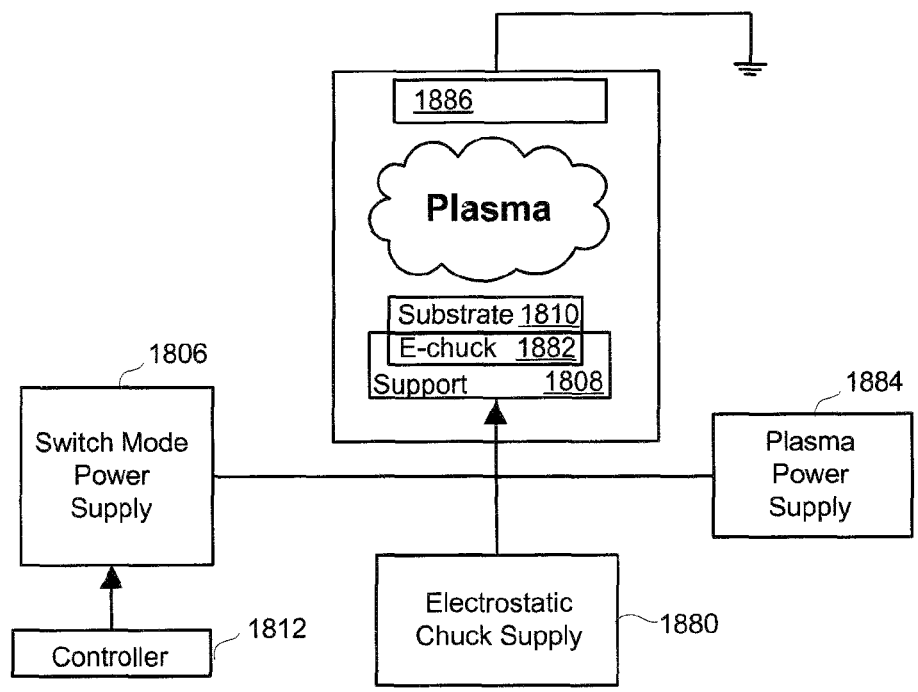
FIG. 18 is a block diagram depicting yet another embodiment of the present invention.

Shown in FIG. 18 is a block diagram depicting yet another embodiment of the present invention in which a plasma power supply 1884 that generally functions to generate plasma density is also configured to drive the substrate support 1808 alongside the switch mode power supply 1806 and electrostatic chuck supply 1880. In this implementation, each of the plasma power supply 1884, the electrostatic chuck supply 1880, and the switch mode power supply 1806 may reside in separate assemblies, or two or more of the supplies 1806, 1880, 1884 may be architected to reside in the same physical assembly. Beneficially, the embodiment depicted in FIG. 18 enables a top electrode 1886 (e.g., shower head) to be electrically grounded so as to obtain electrical symmetry and reduced level of damage due to fewer arcing events.

Figure 19:
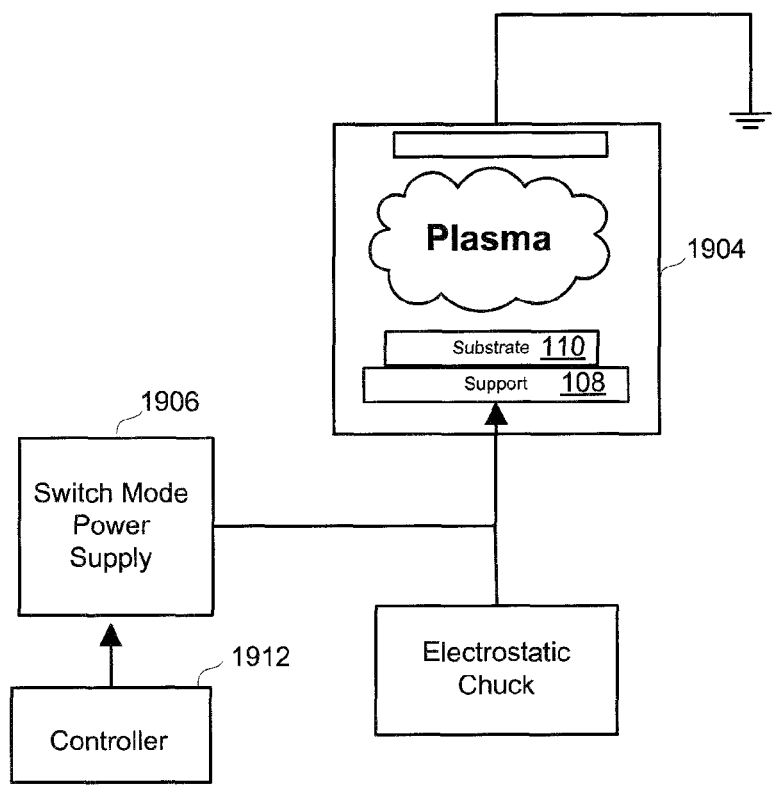
FIG. 19 is a block diagram depicting still another embodiment of the present invention.

Referring to FIG. 19, shown is a block diagram depicting still another embodiment of the present invention. As depicted, the switch mode power supply 1906 in this embodiment is configured to apply power to the substrate support and the chamber 1904 so as to both bias the substrate and ignite (and sustain) the plasma without the need for an additional plasma power supply (e.g., without the plasma power supply 102, 202, 1202, 1702, 1884). For example, the switch-mode power supply 1806 may be operated at a duty cycle that is sufficient to ignite and sustain the plasma while providing a bias to the substrate support.

Figure 20:
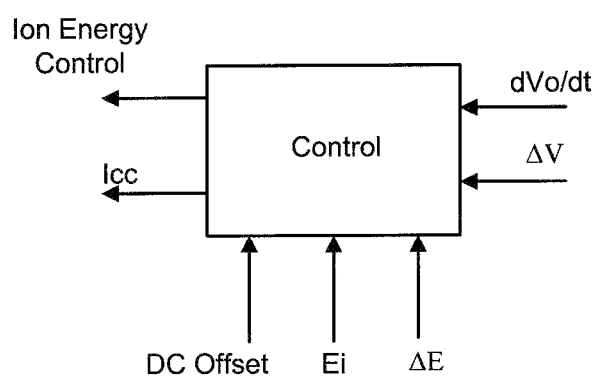
FIG. 20 is a block diagram input parameters and control outputs that may be utilized in connection with the embodiments described with reference to FIGS. 1-19.

Referring next to FIG. 20, it is a block diagram depicting input parameters and control outputs of a control portion that may be utilized in connection with the embodiments described with reference to FIGS. 1-19. The depiction of the control portion is intended to provide a simplified depiction of exemplary control inputs and outputs that may be utilized in connection with the embodiments discussed herein—it is not intended to a be hardware diagram. In actual implementation, the depicted control portion may be distributed among several discrete components that may be realized by hardware, software, firmware, or a combination thereof.

With reference to the embodiments previously discussed herein, the controller depicted in FIG. 20 may provide the functionality of one or more of the controller 112 described with reference to FIG. 1; the controller 212 and ion energy control 220 components described with reference to FIG. 2; the controller 812 and ion energy control portion 820 described with reference to FIG. 8; the ion compensation component 1260 described with reference to FIG. 12; the current controller 1362 described with reference to FIG. 13; the Icc control depicted in FIG. 16, controllers 1712A, 1712B depicted in FIGS. 17A and 17B, respectively; and controllers 1812, 1912 depicted in FIGS. 18 and 19, respectively.

As shown, the parameters that may be utilized as inputs to the control portion include dVo/dt and ΔV, which are described in more detail with reference to FIGS. 13 and 14. As discussed, dVo/dt may be utilized to in connection with an ion-energy-distribution-spread input ΔE to provide a control signal Icc, which controls a width of the ion energy distribution spread as described with reference to FIGS. 12, 13, 14, 15A-C, and FIG. 16. In addition, an ion energy control input (Ei) in connection with optional feedback ΔV may be utilized to generate an ion energy control signal (e.g., that affects Vbus depicted in FIG. 3) to effectuate a desired ion energy distribution as described in more detail with reference to FIGS. 1-11. And another parameter that may be utilized in connection with many e-chucking embodiments is a DC offset input, which provides electrostatic force to hold the wafer to the chuck for efficient thermal control.

In conclusion, the present invention provides, among other things, a method and apparatus for selectively generating desired ion energies using a switch-mode power. Those skilled in the art can readily recognize that numerous variations and substitutions may be made in the invention, its use, and its configuration to achieve substantially the same results as achieved by the embodiments described herein. Accordingly, there is no intention to limit the invention to the disclosed exemplary forms. Many variations, modifications, and alternative constructions fall within the scope and spirit of the disclosed invention.

What is claimed is:

1. A system for plasma-based processing, comprising:
a plasma processing chamber configured to contain a plasma that includes ions;
a substrate support positioned within the plasma processing chamber and disposed to support a substrate,
an ion-energy control portion, the ion-energy control portion including a DC power supply that provides a positive DC voltage that is fixed at a magnitude defined by an ion energy distribution setting, wherein the ion-energy distribution setting is indicative of a desired energy distribution of the ions at the surface of the substrate;
two switching components configured to alternately couple a ground potential and the positive DC voltage from the DC power supply to the substrate; and
an ion current compensation component coupled to the substrate support, the ion current compensation component effecting a controllable width of the ion energy distribution, the ion current compensation component including:
a controllable DC current source consistently coupled to the substrate support to provide uninterrupted compensation current with a fixed magnitude to the substrate support; and
a current controller that monitors a rate of change of a voltage of the DC power that is applied to the substrate support to obtain a measure of current of the ions, and the current controller fixes, based upon the ion current, the magnitude of the compensation current output from the current source to effectuate a monoenergetic distribution of ion energy at the surface of the substrate.

2. The system of claim 1 wherein the ion current compensation component is configured to enable a user to define a spread of a uniform distribution of ion energy.

3. The system of claim 1, wherein the substrate support includes an electrostatic chuck, the system including an electrostatic chuck supply coupled to the electrostatic chuck.

4. The system of claim 1, including an additional power supply coupled to the substrate support, the additional power supply is adapted to apply power to the substrate support so as to sustain the plasma in the plasma processing chamber.

5. The system of claim 1, wherein the two switching components are configured to apply a periodic voltage function to the substrate support responsive to the one or more drive signals;
wherein the ion-energy control portion is configured to modulate, over multiple cycles of the periodic voltage function, at least one parameter of the periodic voltage function responsive to the at least one ion-energy distribution setting so as to generate the desired distribution of energies of ions at the surface of the substrate on a time-averaged basis.

6. The system of claim 5, wherein the at least one parameter includes a voltage amplitude of the DC power supply.

7. An apparatus for plasma-based processing, comprising:
a DC power supply that provides a positive DC voltage that is fixed at a magnitude responsive to an ion-energy setting, wherein the ion-energy setting is indicative of a desired monoenergetic distribution of ion energy at the surface of a substrate;
an output disposed to couple to a substrate support;
two switching components including a first switching component coupled to the positive DC power supply and a second switching component coupled to a ground terminal, the two switching components configured to alternately couple the positive DC voltage and the ground terminal to the output to effectuate the desired monoenergetic distribution of ion energy at the surface of a substrate when the output is coupled to the substrate support; and an ion current compensation component coupled to the output, the ion current compensation component including:
 a controllable DC current source, separate from the DC power supply, that is consistently coupled to the output; and
 a current controller configured to monitor a rate of change of a voltage of the output and maintain an uninterrupted DC current, which is fixed in magnitude, to the output based upon the rate of change of the voltage, wherein the DC power supply and the DC current source are sole sources of power coupled to the output.

* * * * *